US011551602B2

(12) United States Patent
Marsh et al.

(10) Patent No.: US 11,551,602 B2
(45) Date of Patent: Jan. 10, 2023

(54) NON-UNIFORM RESOLUTION, LARGE FIELD-OF-VIEW HEADWORN DISPLAY

(71) Applicant: Innovega Inc., Bellevue, WA (US)

(72) Inventors: Jay Marsh, Bellevue, WA (US); Mark Freeman, Bellevue, WA (US); Jerome Legerton, Bellevue, WA (US); Steve Willey, Bellevue, WA (US)

(73) Assignee: INNOVEGA INC., Bellevue, WA (US)

( * ) Notice: Subject to any disclaimer, the term of this patent is extended or adjusted under 35 U.S.C. 154(b) by 0 days.

(21) Appl. No.: 15/693,119

(22) Filed: Aug. 31, 2017

(65) Prior Publication Data

US 2018/0090052 A1 Mar. 29, 2018

Related U.S. Application Data

(60) Provisional application No. 62/382,562, filed on Sep. 1, 2016.

(51) Int. Cl.

| | |
|---|---|
| ***H01L 27/32*** | (2006.01) |
| ***G02B 27/01*** | (2006.01) |
| ***G09G 3/20*** | (2006.01) |
| ***G09G 3/34*** | (2006.01) |
| ***G09G 3/00*** | (2006.01) |

(52) U.S. Cl.

CPC ........... *G09G 3/2092* (2013.01); *G09G 3/001* (2013.01); *G09G 3/20* (2013.01); *G09G 3/3406* (2013.01); *G09G 2320/062* (2013.01); *G09G 2340/0407* (2013.01); *G09G 2340/0457* (2013.01); *G09G 2354/00* (2013.01)

(58) Field of Classification Search

None

See application file for complete search history.

(56) References Cited

U.S. PATENT DOCUMENTS

2002/0135731 A1* 9/2002 Wolfe .................... G09G 3/005 349/192
2009/0295683 A1* 12/2009 Pugh .................. G02B 27/0101 345/9
2012/0120498 A1* 5/2012 Harrison ................. G06F 3/012 359/630
2014/0267611 A1* 9/2014 Kennett ................. G06V 40/20 348/46
2015/0178939 A1* 6/2015 Bradski .................. H04N 13/00 345/633
2018/0040676 A1* 2/2018 Hack .................. G02B 27/0172

* cited by examiner

*Primary Examiner* — Carl Adams

(74) *Attorney, Agent, or Firm* — Viksnins Harris Padys Malen LLP

(57) ABSTRACT

A display system includes a rendering engine, a display driver, an image source, and display optics. The rendering engine receives a non-uniform resolution distribution pattern and generates one or more rendered pixels. The display driver receives the one or more rendered pixels and generates one or more display driver pixels. The image source device receives the one or more display driver pixels and generates an image. And the display optics receives the image and provides a display optics image having a space-variant resolution that follows the non-uniform resolution distribution pattern.

19 Claims, 17 Drawing Sheets

NON-UNIFORM RESOLUTION, LARGE FIELD-OF-VIEW HEADWORN DISPLAY

CROSS-REFERENCE TO RELATED APPLICATIONS

This application claims priority to U.S. Provisional Application No. 62/382,562 that was filed on 1 Sep. 2016. The entire content of the application referenced above is hereby incorporated by reference herein.

BACKGROUND

Headworn displays can present visual information to the wearer in a mobile format that moves with the user. The information is private, viewable only by the user, and can range from simple, small field-of-view (FOV) textual or graphical information, to complete immersion of the viewer in a virtual environment. Virtual Reality (VR) uses a wide FOV occluded display along with motion sensors and realistic audio to create the virtual world experience. Augmented Reality (AR) or Mixed Reality (MR) overlays the computer-generated video on top of the world view that the user sees with his/her normal vision, either to provide information about what the user is seeing in the world view, or to create virtual or "holographic" objects and place them into the user's world view in such a way that, to the person wearing the AR headworn display, they appear to be part of the real world. The key to creating the illusion, whether a synthetic virtual world or an augmented extended reality, is that the display must have all the properties of the normal visual field. That is, the display must have a large FOV, with a frame rate sufficient to provide smooth motion with no perceptible flicker, and a full color gamut covering the range of colors and range of brightness visible to humans.

20/20 vision corresponds to the ability to resolve visual details down to one arc-minute in angular size. Current digital video standards of 1080P and 720P present full color frames at 60 Hz (in the USA). High quality digital video encodes each full color pixel using 16-24 bits. These standards are used for high quality computer displays and home theater displays. Typically, the FOV for these displays ranges from 15 to 40 degrees. An emerging rule-of-thumb for virtual reality is that the immersive experience requires a field-of-view of approximately 100°. If we want to maintain all of these qualities for an immersive headworn display, the data rate requirements are enormous. For example, a 100° diagonal FOV, 16:9 aspect ratio display with one arcmin pixels using 24 bits per pixel at a frame rate of 60 Hz equates to a data rate of 22.15 Gbps (Giga bits per second). This is on the order of the data rates seen in state-of-the-art rendering farms used by Hollywood. For a headworn display, this data rate would need to be maintained by the video rendering engine, the data transmission link with the display, and the display driver, something that is impractical and impossible with today's technology for consumer level, portable, display electronics.

Another problem emerges when we look at the display technology needed to support a display of this size. Using the same example as above, a 100° diagonal FOV, 16:9 aspect ratio display with one arcmin pixels calculates to about 5250×2950 pixels. Microdisplay panels with 1080P resolution (1920×1080 pixels) have only recently become available. So-called 4K microdisplay panels (4096×2160 pixels) have been demonstrated in laboratories and may emerge commercially in years to come, but they would still fall short of delivering 1 arcmin pixels over a 100° FOV.

For these and other reasons there is a need for the teachings of the present disclosure.

SUMMARY

The human eye and human visual system is not based on a uniform grid of photoreceptors over the full visual FOV. Instead, the density of the photoreceptors and processing cells is highest at the central foveal position of the retina and the density decreases with distance from the fovea. By designing the display that presents virtual or augmented reality to be consistent with these eye properties, the total number of pixels per frame that must be rendered and transmitted to the display can be reduced significantly. We present display system architectures that have high pixel density in the region(s) where the central gaze of the eye lies and progressively lower pixel densities as a function of distance from the central gaze position.

In this way, the display can support a large FOV with high pixel density and image sharpness in the central view region where it is needed, while reducing the overall number of pixels in each display frame, thereby reducing the computational load, data rate, and power required to run the display system.

Currently, the available image source devices for headworn displays all are comprised of arrays of uniformly sized pixels and do not have a sufficient number of pixels to produce a display image that has both a large FOV and pixel size compatible with 20/20 visual acuity. As a consequence, existing headworn display systems must choose a compromise position, either maintaining the large FOV and letting the pixel size grow so that the sharpness is more like 20/30 or 20/40 vision, or reducing the FOV in order to maintain 20/20 pixel size. And even if the image source devices with a sufficiently large number of pixels become available, they will require huge computational powers and data rates mentioned previously, in order to render and display the video images.

According to one embodiment, an optical projection system is used to create a non-uniform distribution of pixel sizes such that pixels in the central region of the display, where they are in the foveal visual field, have a pixel size compatible with 20/20 visual acuity (i.e. approximately 1 arcmin angular size), and the pixels displayed outside of the foveal field have larger pixel sizes that grow progressively with distance from the foveal field. In this way, a smaller number of pixels are displayed with non-uniform pixel size distribution such that the display simultaneously realizes an effective high visual acuity compatible with 20/20 vision and a large immersive FOV.

DETAILED DESCRIPTION

Figure 1:
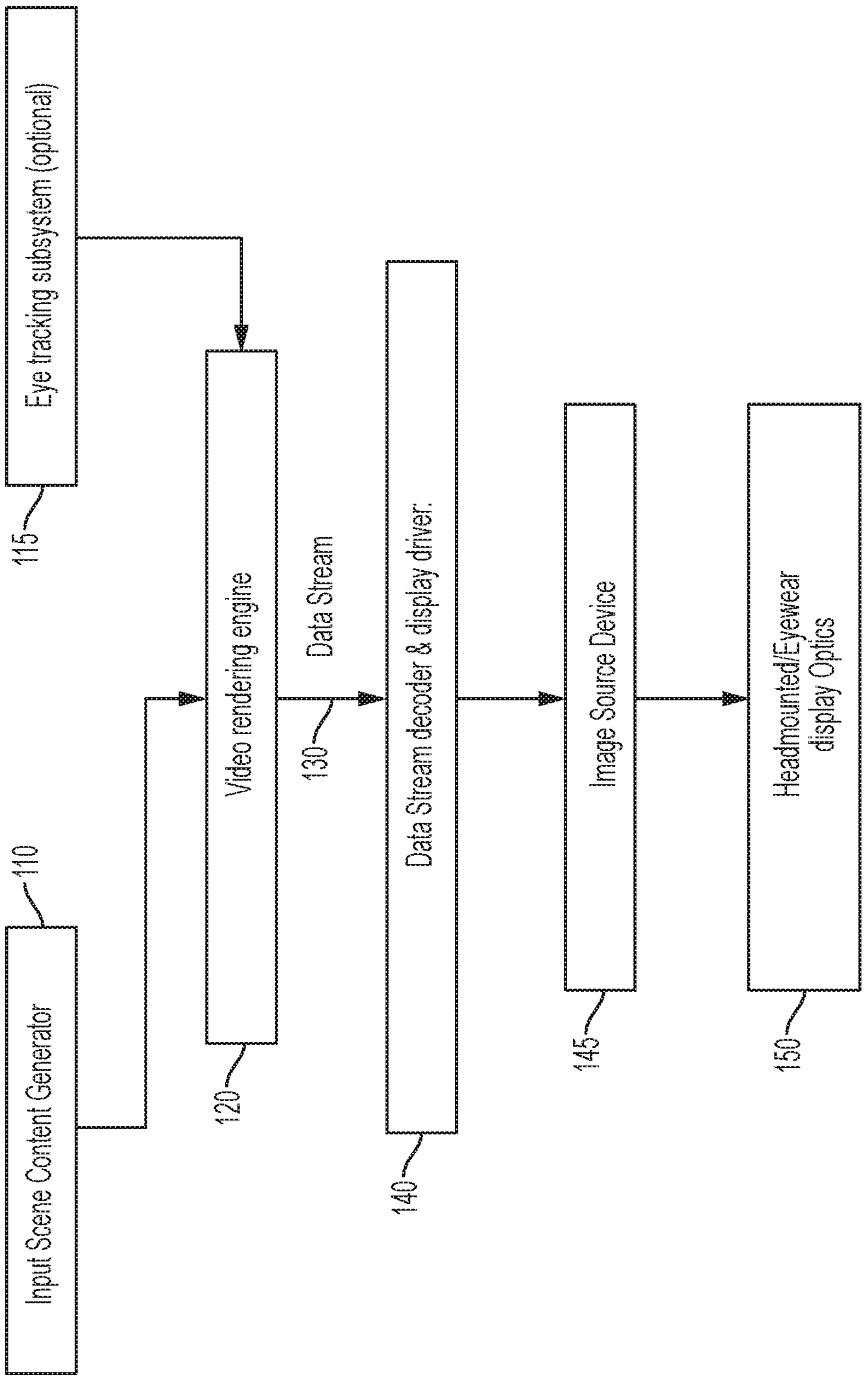
FIG. 1 Block diagram of the elements making up the Non-Uniform Resolution, Large Field-of-View, headworn display FIG. 2 a) Diagram of a possible pixel binning configuration used in an embodiment and the associated resolution zones shown mapped on a display Field of View, b) Diagram of a possible pixel configuration used in an embodiment where the physical pixel size changes from zone-to zone in the manufactured image source device and the associated resolution zones shown mapped on a display Field of View.

FIG. 1 shows a block diagram of the non-uniform resolution, large field-of-view, headworn display system. The elements in the display system are each described below.

110. Input scene content generator: This subsystem contains the model for the content that will be displayed. In a VR system, it contains the model of the virtual world that is being synthesized as well all the information needed to model the interaction of the system user with the virtual world, that is, information like the user's location, posture, head position and orientation, perhaps even facial expression, verbal command recognition, etc. This information about the user comes to the input scene content generator via various sensors including cameras, accelerometers, gyroscopes, GPS sensors, microphones and many other possible sensors. Of particular interest for the display content is the user's location and head orientation in the coordinate system of the virtual world model so that the system knows what portions of the virtual world can be seen by the user at any given moment. Similarly, in an AR or MR system, this subsystem contains a model of all the information described above for the VR system, plus knowledge of the actual physical world and its spatial relation with the virtual world model or virtual content to be displayed. Typically, the virtual world model consists of wireframe or polygon models of objects and environments along with texture models for the virtual element surfaces and lighting models of the virtual environment.

115. Eye Tracking Subsystem (Optional): In some embodiments, an eye tracking subsystem is used to provide information on precisely where the eye is gazing at each instant so that the high resolution display content can be positioned within the display field at the location being seen by the central foveal high acuity portion of the user's vision. Any type of eye-tracking system can be used as long as it provides the instantaneous gaze direction of the user. This includes camera-based or photodetector-based systems that watch the person's eyes and automatically determine gaze direction, active systems based upon illuminating the eye with a light beam that has special properties which allow the eye's position to be determined from the reflected light, as well as systems where the user wears a contact lens or has something embedded in the eye which transmits the eye's position or which can be used together with eye illumination to make the eye's instantaneous position known.

120. Video rendering engine: The video rendering engine uses the information on the user's location, head orientation and gaze direction (if available) to determine what in the virtual environment can be seen by the user. It renders each pixel within the FOV by calculating the perspective view from the user's location in the virtual environment and applying the texture rules and lighting rules as determined by the physics that govern the virtual environment. This is a computationally demanding operation that scales with the number of pixels that must be rendered. The more pixels, the more time and complexity that is needed to render each video frame. By rendering pixels on a non-uniform grid that has a high density of pixels in the central view area where the user's visual acuity is best and a progressively lower density of pixels as the distance from the user's visual axis increases, it is possible to significantly reduce the number of pixels that must be rendered for each video frame thereby reducing the time, computational complexity, and power needed by the rendering engine.

130. Data Stream: The data stream represents the digital pixel brightness and color levels that must be transferred from the rendering engine to the display driver. The data rate required scales directly with the number of pixels per video frame. Fewer pixels mean a lower data rate which means reduced power and complexity for the data transmitter and data receiver and transmission line.

140. Data Stream decoder and display driver subsystem: The data stream decoder and display driver subsystem receives the data stream and converts it into signals to drive the pixels in the display image source device. Each type of image source device has its own type of signal needed to drive the display. Reducing the number of pixels in a video frame allows the decoder and driver to run at a lower speed thereby reducing power, cost, shielding requirements, as well as heat generated by the circuit and display that must be dissipated to keep the headworn display system at a comfortable temperature.

145. Display image source device: The miniature displays that serve as image source devices for the headworn display are often called microdisplays. Most of the suitable microdisplays are rectilinear arrays of pixels with equal-sized pixels arranged in rows and columns. Typically, their size is less than an inch along the diagonal while some may be as large as 2-inch diagonal and some as small as 0.25-inch diagonal. Many types of display technology are suitable for use as image source devices including LCOS (liquid crystal on silicon), OLED (organic light emitting diode), DLP (digital light processing from Texas Instruments). Another style of image source device that could be used is LBS (laser beam scanning) where red, green, and blue lasers are scanned by a moving micro-mirror in a pattern similar to the raster scan used in CRT (cathode ray tube) televisions.

The number of pixels in the display image source device and their distribution is directly related to the FOV and sharpness of the display. For the purpose of explanation, assume that the image source device pixels are uniformly distributed in N rows and M columns and the display optics also present the pixels to the user's eyes in uniformly distributed rows and columns. Then the horizontal FOV is represented by M pixels and the vertical FOV by N pixels. If the FOV is 30×15 degrees and M=1800, N=900, then each pixel represents 1 arcmin of field and the display image is very sharp, consistent with 20/20 vision (for which the minimum angular resolution is 1 arcmin). But, if instead this same image source device is optically magnified to a 90×45 degree FOV, then, each pixel now represents 3 arcmin, and the user will see this display as very pixelated, albeit with a pleasingly large FOV. If we want to have both the large 90×45 degree FOV and 20/20 image sharpness simultaneously, then the number of pixels must grow to 5400×2700. This is a huge number of pixels for a headworn display image source device, significantly more than is currently available in any microdisplay, and having consequences of increased power, size, and complexity in the video rendering engine, the data stream, the data stream decoder and display driver, and the image source device.

If instead, the pixels are non-uniformly distributed, with high pixel density in the area right in front of where the user is looking consistent with the high visual acuity in the central foveal region of a person's vision, and if the pixel density decreases with distance from the central viewing axis, then it is possible to achieve both a large FOV and 20/20 image sharpness and still maintain a manageable low number of total pixels.

One way to accomplish this is shown in FIG. 2. The pixels in the image source device are divided into zones. The central zone has small pixels (high pixel density). The next zone has pixels that are twice as big. In the third zone, the pixel size again increases as it does for each subsequent zone in the image source device. The central zone is selected to be the pixels in the central portion of the FOV with an angular radius corresponding approximately to the range of eye motion that is comfortable for sustained viewing. Typically, when a person wishes to view something that is off-axis, they move their eyes and turn their head. The head turning propensity varies from person to person, but most people find it uncomfortable to hold their eyes at an off-axis position of more than 15 degrees for sustained viewing. When the angle is more than 15 degrees, most people will turn their head as well as move their eyes so that the eye position is 15 degrees or less. Based on this, the angular radius of the central zone would be 15-20 degrees. The actual value for the boundary between the central zone and the adjacent zone as well as the boundaries between subsequent zones would be determined by a combination of studying the literature on Human Vision and performing human factors testing.

Figure 2A:
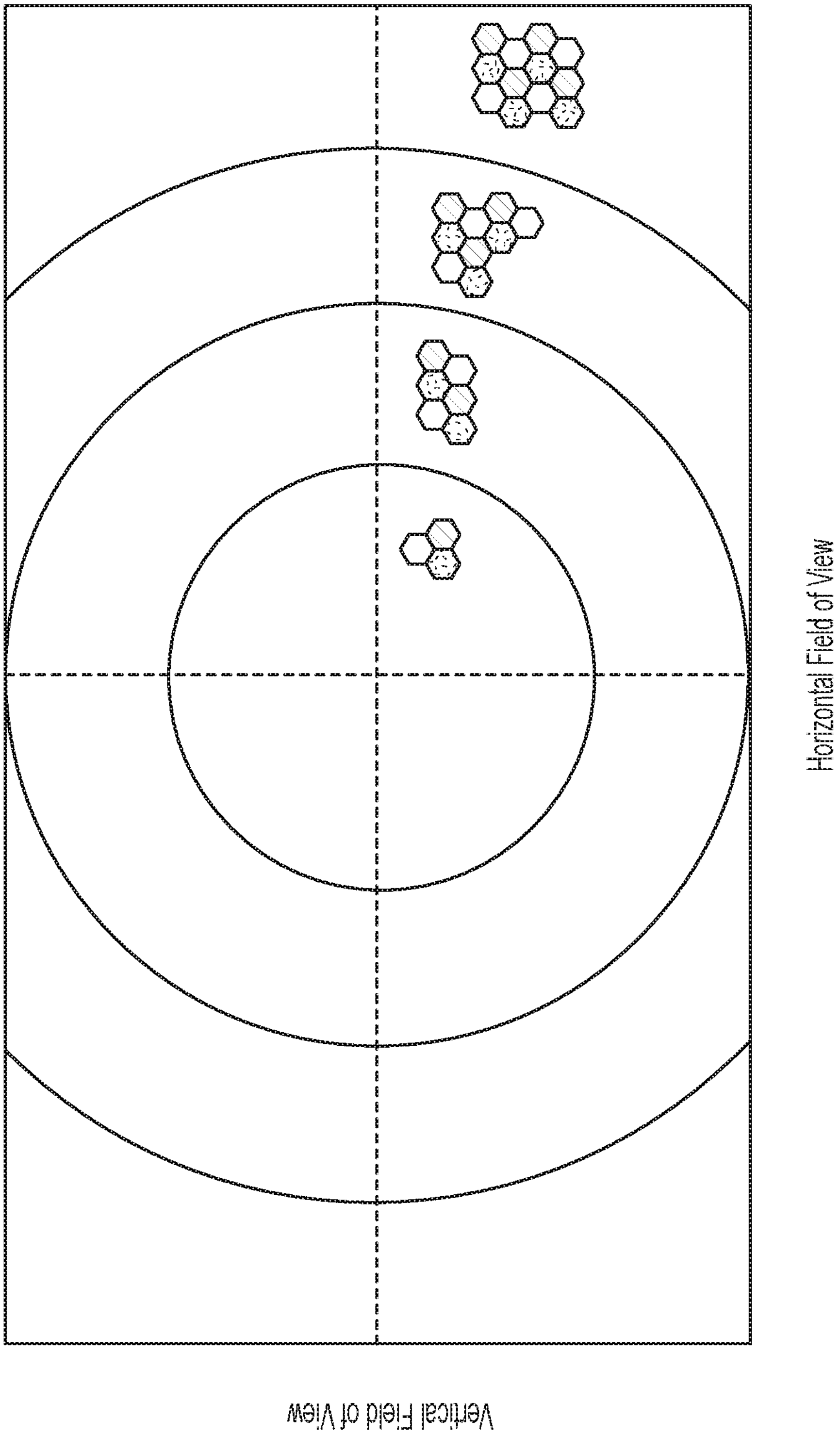

FIG. 2*a* shows the zone approach applied to a display where each full color pixel is represented by a triad of three subpixels, one red, one green, and one blue. The zone approach can also be applied to any other type of microdisplay, including those where the number of subpixels making up a single color pixel is different than three, and those where color is achieved by field-sequential illumination, i.e., where a color video frame consists of a rapid sequence of red, green and blue fields (typically at 180 Hz or faster so that the full color video frame rate is ≥60 Hz.)

In one embodiment, the zones with larger pixels than the central zone are created using an interconnection pattern applied during manufacturing of the microdisplay panel. In this way, the zoned microdisplay panel can be manufactured using the same methods as a standard panel with uniform pixel size except that one interconnection layer is added to the manufacturing process, creating bigger effective pixels in zones other than the central zone by electronically connecting (binning) 2, 3, or more pixels together.

Figure 2B:
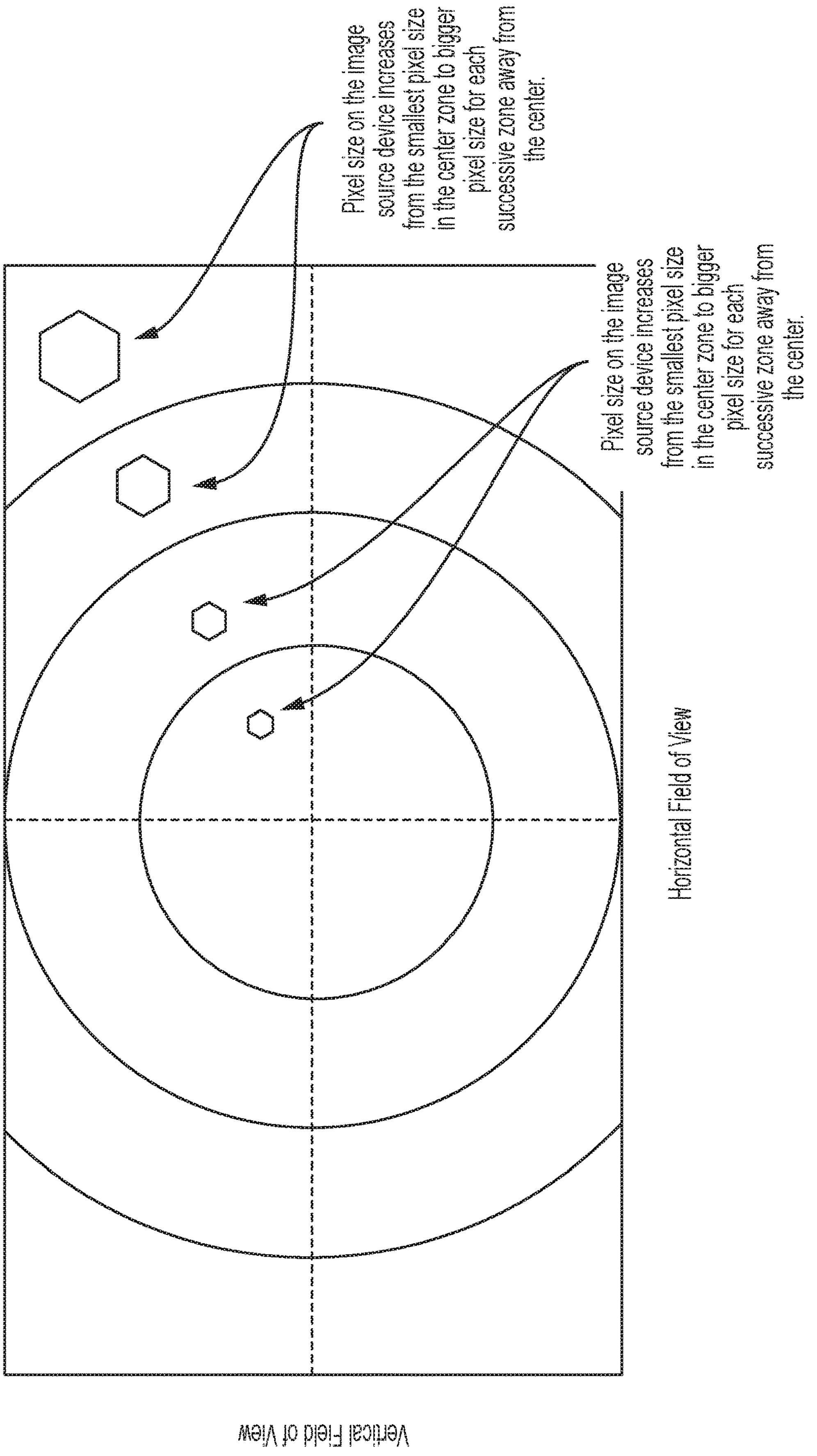

In another embodiment shown in FIG. 2*b*, the microdisplay manufacturer builds devices where the physical pixel size changes, growing bigger as the distance from the display center increases.

In another embodiment, standard microdisplay panels with uniform pixel size are used as the image source device, and the pixel binning is done by the data stream decoder and display driver subsystem. In other words, the video image is rendered with non-uniform resolution and a reduced pixel count data stream is transmitted, and the data stream decoder and display driver uses knowledge of the zone layout to bin pixels into effectively larger pixels by driving 2, 3, or more pixels with the same drive level.

In another embodiment, the zone positions change with the user's gaze direction. Eye tracking is used to determine precisely the user's gaze direction. The gaze direction is used by the rendering engine as the user's visual axis. Pixels are rendered with non-uniform resolution with the highest resolution (highest sampling density) at the visual axis and with zoned decreasing resolution following the acuity roll-off of human vision with angle or distance from the visual axis. The location of the visual center is transmitted in the reduced pixel count data stream. The decoder and driver system drives the pixels in a zone around the visual axis pixel location with the highest pixel density and bins 2, 3, or more pixels together in zones surrounding the central zone.

In another embodiment, the image source device produces an input image that uses uniform pixel size. The rendering engine renders the image according to a non-uniform resolution pattern, but the remapping of the reduced pixel number into pixels of different sizes is performed by the headworn display optics.

150. Headworn display optics: The headworn display optics relays the image produced on the image source device to the user's eyes. The image source device is too small and too near to the user's eyes to be viewed directly. Many types of headworn display optics have been built by experts over the past twenty years and also produced as headworn display products. These include beamsplitter relays, waveguide image relays, refractive image relays, reflective image relays, diffractive image relays and combinations of these. Any of these relay types are also suitable for use with the above-described non-uniform resolution microdisplays where the pixel size varies either due to an actual physical variation in the manufactured pixel size or due to the fixed or dynamic pixel binning. The FOV of the optical relay must be matched to the intended FOV for which the non-uniform resolution pixel size distribution was designed.

The majority of headworn display optics create an eyebox or expanded exit pupil at the user's eye. The light entering the eye is nearly collimated with almost parallel beams (or slightly diverging) from every angle within the FOV being present at each point in the eyebox or exit pupil. The user sees a virtual image of the display filling the FOV at some apparently distant point in space from the user (at infinity if the beams in the exit pupil are perfectly collimated). Using headworn display optics that have the properties just described, the non-uniform resolution microdisplay image source device can be directly substituted for the uniform microdisplay image source device of the same physical size and technology. The display FOV must be compatible with the specific design of the non-uniform resolution pixel distribution.

Figure 3:
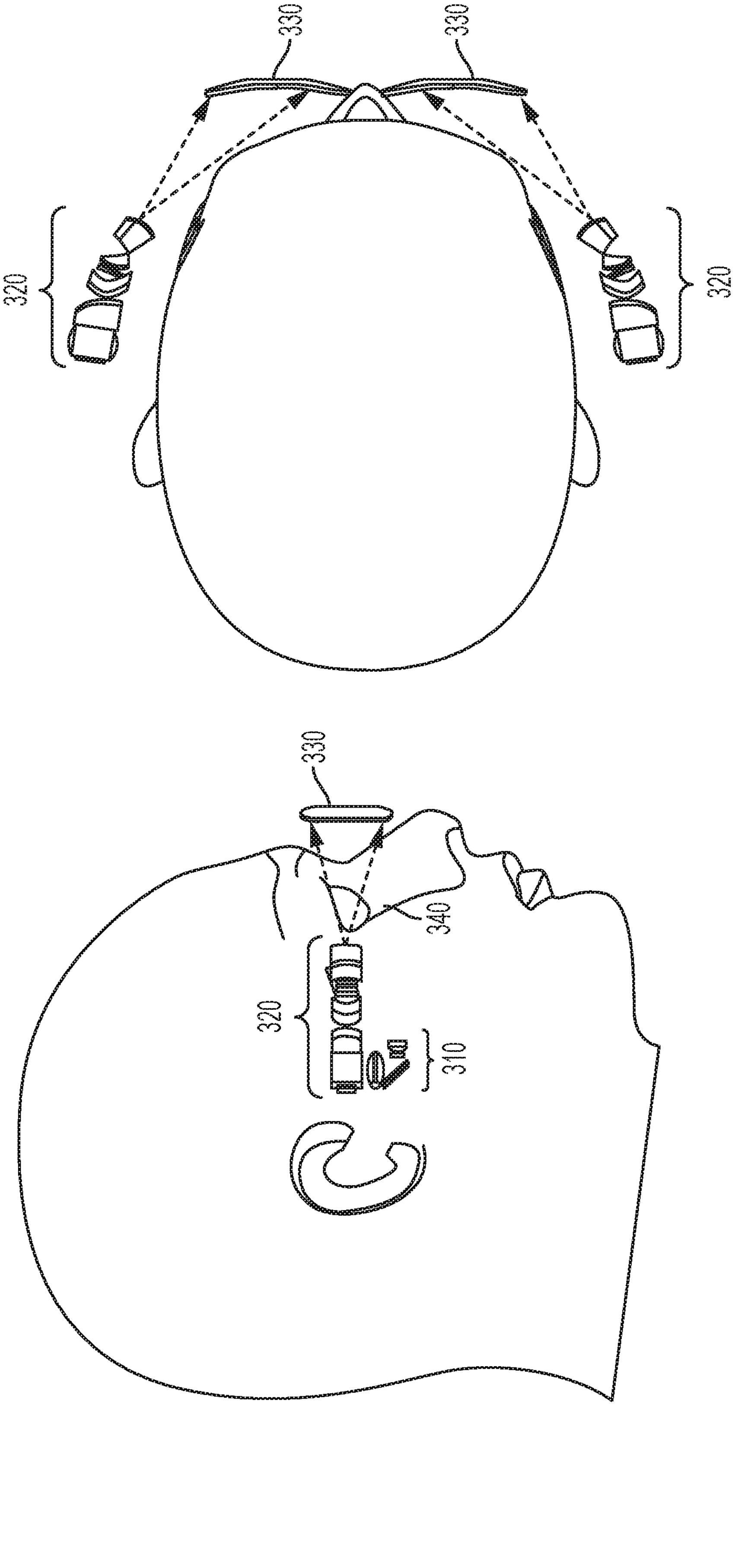
FIG. 3 Sketch of the headworn projection optics and transparent screen used in an embodiment.

FIG. 3 shows an alternative design of the headworn display optics used in an embodiment. The image source device with its illumination system 310 and display driver sit at the rear end of the projection optics 320, both mounted together along the temple(s) of the display eyewear (or visor, goggles, helmet) worn by the user. The projection optics 320 project the video image onto transparent screens 330 that serve as the spectacle lenses in the display eyewear. The transparent screen(s) 330 have the properties that they are transparent with no blurring or scattering for transmitted light but serve as an image screen for reflected light. That is, light projected onto the transparent screen is partially reflected and each point is scattered so that the reflected light can be seen from multiple directions (at least 2 but typically the reflected light can be seen from a range of viewing angles or viewing positions). The custom contact lens 340 has a high power lenslet of diameter smaller than the eye's pupil in its center. This lenslet adds focusing power to the user's normal vision so that (s)he is able to focus on the transparent screen and clearly see the image projected there. To the user, the image on the screen appears to be large and at a significant distance away from the user. At the same time, light can also enter the user's eye through the outer pupil region not covered by the small lenslet, thereby providing a path for normal vision so that the user can simultaneously view the real world environment through the transparent screen(s). This headworn optics system is well-suited for AR and MR systems.

Figure 4:
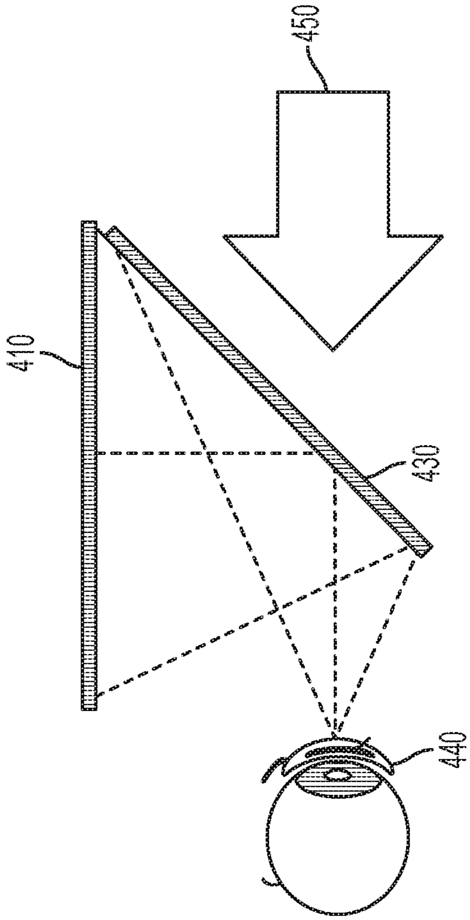
FIG. 4 Alternate Optical architecture for headworn display used in an embodiment FIG. 5 Diagram showing an embodiment of a fixed or static non-uniform resolution distribution pattern as a function of angle over the Field of View.

In one embodiment, the projection optics 320 by design are used to re-map the image source device pixels from a uniform pixel size distribution to a non-uniform resolution image on the transparent screen. This will be discussed in greater detail below. FIG. 4 shows another design for the head-mounted display optics. This embodiment uses the same custom contact lens described in relation to FIG. 3. The custom contact lens 440 also contains polarizing filters such that only light of a particular polarization is permitted to enter the eye through the lenslet and such that only light of the orthogonal polarization can enter the eye through the normal vision path in the outer pupil region. In this case, the microdisplay image source device and driver 410 is viewed directly using the high power lenslet in the contact lens to allow the user to focus on the nearby device. The polarizing beamsplitter 430 serves as a polarizer and folding mirror for light from the image source device, so that the image source light is properly polarized to enter the eye through the lenslet. At the same time, the polarizing beamsplitter transmits light from the ambient environment that is polarized orthogonal to reflected light from the image source. Therefore, the ambient light enters the eye through the normal vision path in the outer pupil region. This design of head-mounted optics is also well-suited to AR and MR systems. It can be used with any of the non-uniform zoned micro-display image source devices described earlier.

By non-uniform resolution distribution pattern (also referred to as non-uniform resolution mapping), we mean the planned functional form of the resolution versus field angle. This may be a discontinuous function with step changes in resolution at some particular field angles, (e.g. resolution of 1 arcmin for field angles from 0 degrees to 20 degrees, resolution of 2 arcmin from 20 to 25 degrees and so on), or it may be a smooth function with target values at particular field angles (e.g. 1 arcmin resolution from field angles of 0 degrees to 5 degrees, then a gradual reduction in resolution starting at 5 degrees field angle and passing through 2 arcmin resolution at 7.5 degrees field angle, passing through 4 arcmin resolution at 12.5 degrees resolution and so on). The field angles used in the non-uniform resolution distribution pattern may be absolute field angles where 0 degrees indicates the on-axis field position of the display and optics, or the field angles may be relative to the instantaneous gaze direction of the viewer as determined by an eye-tracking subsystem. Example non-uniform resolution distribution patterns are shown in FIGS. 2*a*, 2*b*, 5, and 10.

Figure 5:
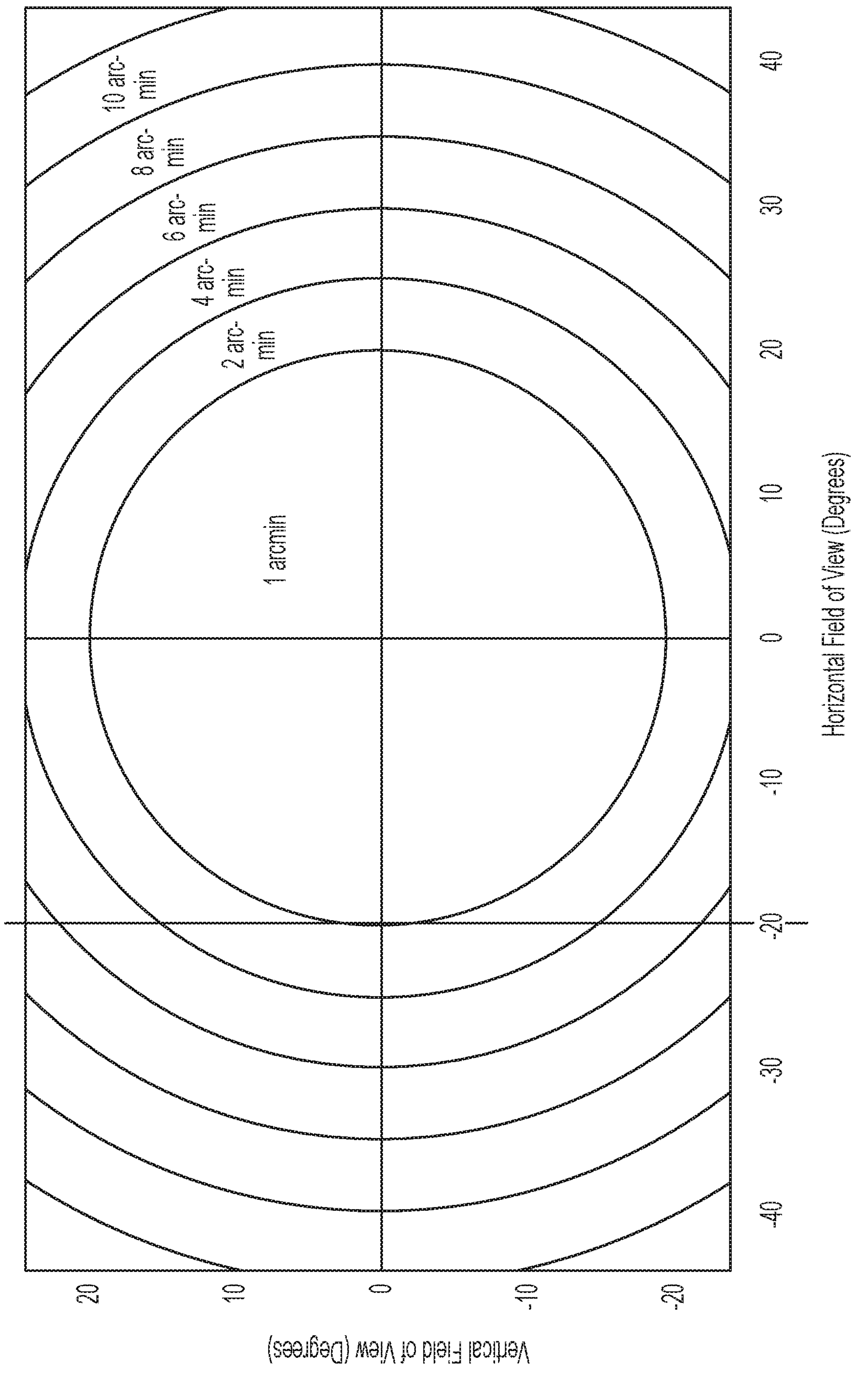

FIG. 5 shows one embodiment of a non-uniform resolution display distribution pattern and its minimum angular resolution values as a function of angle within the FOV. It is shown for a diagonal FOV of 100° with a 16:9 aspect ratio. This embodiment has 1 arcmin resolution over its central 20 degree radius circular FOV. This is consistent with the eye having a comfort zone for sustained viewing of less than 15-20 degrees off-axis gaze. Beyond this central region, the resolution of the display decreases with angle. Although for ease of graphing, the boundaries of the various regions are shown with solid lines, they need not be taken as precise boundaries where the minimum angular resolution makes a step change in its value. In some embodiments, they may be the boundaries of step changes in minimum angular resolution while in other embodiments, the values shown, 2 arcmin, 3 arcmin, etc., indicate the average value of the minimum angular resolution for these regions of the FOV, and the change of minimum angular resolution is smooth and continuous over the FOV outside the central region. The distribution shown in FIG. 5 is a nominal distribution for a static or fixed resolution roll-off. Nominally, the radius of the central high resolution region will be between 12 and 25 degrees for a static non-uniform resolution system and 3-10 degrees for a dynamic non-uniform resolution system. Nominally, the rolloff outside of the high resolution central region will be about 2 arcmin per 5 degrees. The precise radius of the central high resolution region and the rate of the roll-off as a function of angle will be determined by human factors testing. The resolution versus field of view map, to which the display is designed, i.e., FIG. 5 and FIG. 2, is a novel feature of this invention. The use of a large central high resolution region which can accommodate eye movement within the eye's comfort zone for stationary viewing such as the region labeled "1 arcmin" in FIG. 5 is also a novel feature of this invention.

Figure 6:
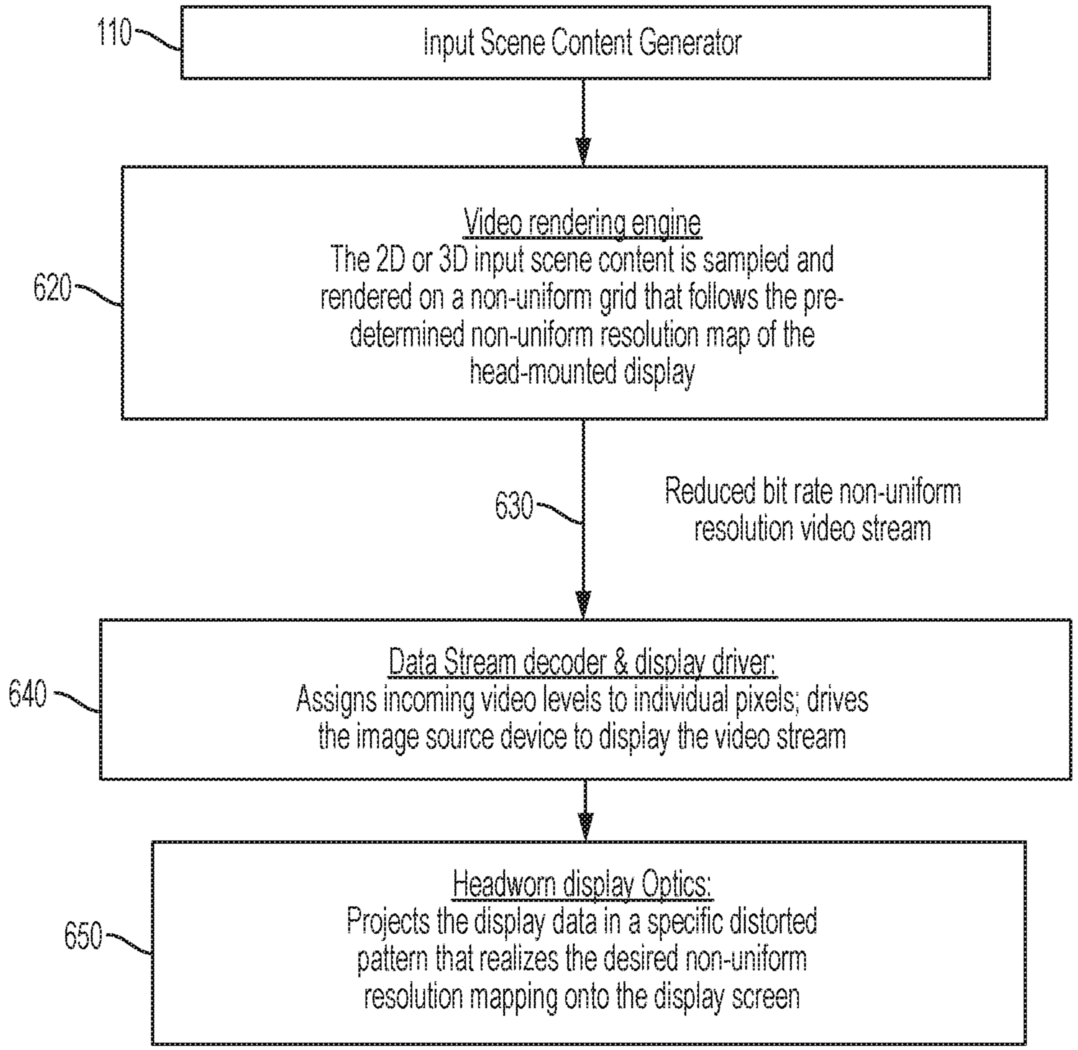
FIG. 6 Process Flow diagram for fixed-pattern non-uniform resolution headworn display Embodiment 1
Figure 7:
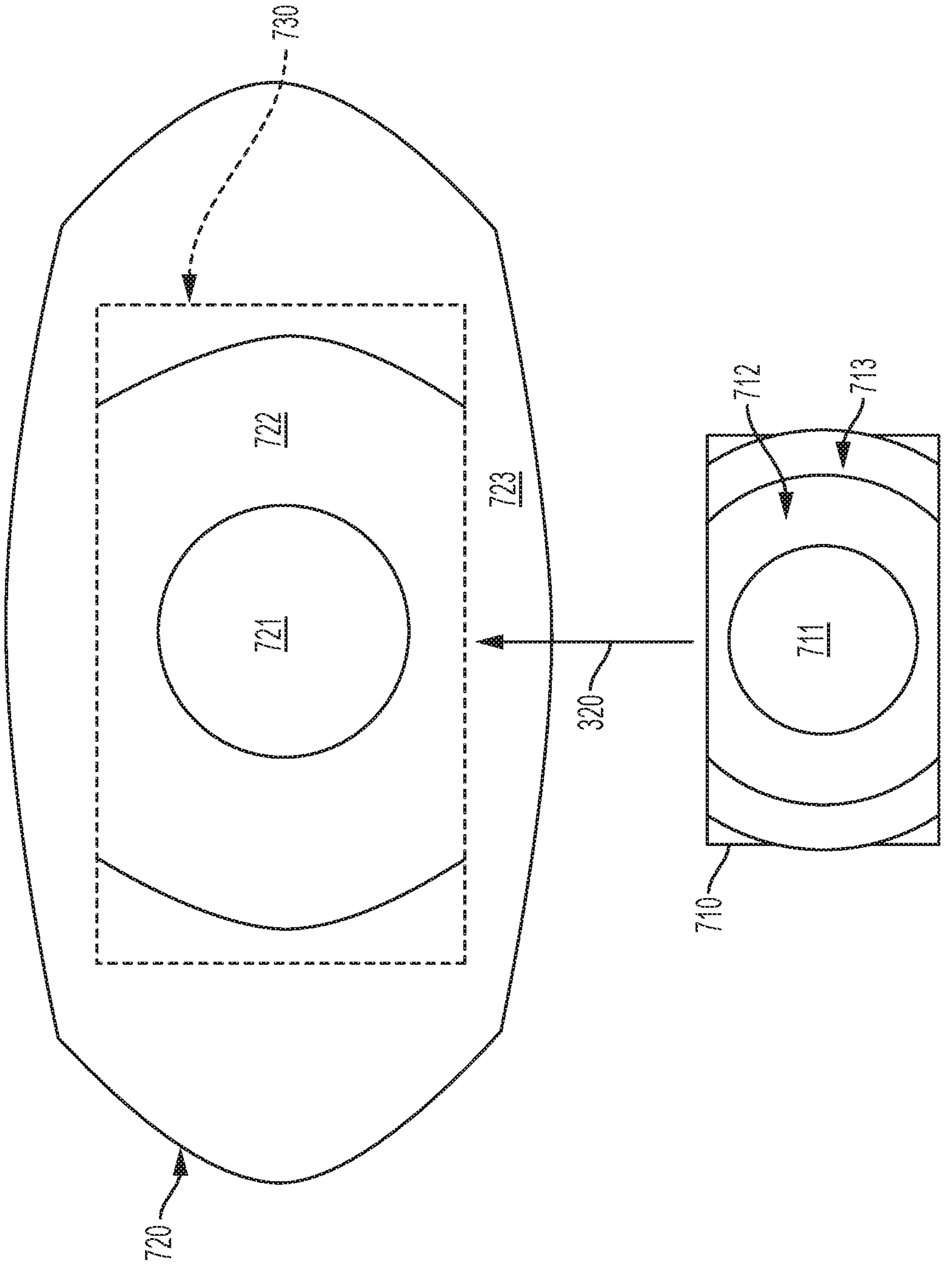
FIG. 7 Drawing of a distorted optical projection pattern and the associated pixel source regions on the image source device as might be used in Embodiment 1

FIG. 6 shows the process flow diagram for Embodiment 1. This embodiment is based on a fixed pattern of resolution roll-off such as that shown in FIG. 5. The input scene content generator 110 contains the virtual environment as wire frame models, texture and lighting rules, as well as the knowledge of the user's head position and orientation within the virtual environment. As the user moves and looks around, different views of the virtual world will be rendered. The video rendering engine 620 renders the virtual world pixels within the user's FOV according to the known and fixed non-uniform resolution distribution. In other words, if the mapping shown in FIG. 5 is used, the rendering engine will sample and render the virtual world with a 1 arcmin sampling grid for the central 20 degree radius FOV. Naturally, "center" is tied to the head orientation of the user, i.e., to where the user is looking, not to some specific location within the virtual world. Since the static non-uniform resolution pattern has a central region that allows for eye motion, eye tracking is not necessary for this embodiment. Center is defined by the straight-ahead view given by the orientation of the head. As the scene rendering progresses outside of the central high resolution region, the sampling grid spacing becomes larger and larger following the fixed non-uniform resolution pattern as the distance from the center of the FOV increases. The increase in sampling grid spacing may or may not be accompanied by a local low-pass filtering of the virtual world content so that the local content does not introduce aliasing artifacts when sampled with the larger sampling grid. This results in rendering a smaller number of pixels than would be the case had uniform resolution been used. For example, consider a display with 100° diagonal FOV and 16:9 aspect ratio. If this display is rendered with uniform resolution of 1 arcmin, each video frame has approximately 15.1 Million pixels. If instead, it is rendered according to the non-uniform resolution distribution shown in FIG. 5, each video frame has about 5.4 Million pixels, a savings of more than 60%. This reduced pixel count/reduced bit-rate data stream is transmitted to the display driver. The display driver drives an image source device that has uniformly distributed pixels all of the same size. The image on the image source device will appear distorted—compressed at the periphery. It is the head-worn optics that create the non-uniform resolution mapping in this embodiment. The image as seen on the image source device is, in fact, pre-distorted in a manner that is complementary to the distortion that will be introduced by the optics. Let the headworn optics be those shown in FIG. 3. The projection optics 320 are designed to provide an accurate image in the central region but to have high distortion for the pixels away from the center of the display such that the outer pixels are stretched and shifted to the FOV positions given by the non-uniform resolution distribution (e.g. FIG. 5). This is shown diagrammatically in FIG. 7. In other words, the display optics are designed with intentional distortion that stretches and redistributes an image of the image source device such that the desired non-uniform resolution mapping is achieved. Whereas distortion is usually seen as an aberration in optical systems and designers work to remove or minimize distortion, in this case, distortion is intentionally introduced into the optical system to achieve the desired non-uniform resolution mapping. The pre-distortion seen in the image on the image source device 310 is undone by the distortion in the projection optics 320. The viewer wearing the custom contact lens 340 and looking at the projected image on the transparent screen 330 will see the proper undistorted view of the virtual environment from his point of view in the virtual world space. The scene that the viewer sees will have non-uniform resolution following the distribution that was used by the rendering engine.

In conjunction with using optical distortion in the display optics to redistribute light from the pixels on the image source device into the desired non-uniform resolution distribution, it may be desirable for the image source device illumination beam to have a non-uniform brightness profile. This is because, by effectively stretching or enlarging pixels using distortion so that the pixel size increases with distance from the center of the display FOV, the effective brightness of these pixels decreases with their area. A non-uniform brightness illumination beam that is brighter at the edges than at the center would compensate for this effect by providing more illumination to pixels that will be bigger in the display as presented to the user's eye(s), thereby giving an overall uniform brightness to the display. Embodiment 1 shown in FIG. 6 includes novel features 620, the video rendering engine that renders according to the non-uniform resolution distribution pattern (e.g., FIG. 5), 640, the display driver that loads pixels onto the image source device in a pre-distorted pattern, and 650, the projection optics (also shown in FIG. 3 and FIG. 7 as 310 & 320, image source and projection optics) that distort the projected image to display the desired non-uniform resolution distribution to the user. The projection optics (650, 310 & 320) also include the novel feature of illuminating the image source device with a beam that is dimmer at the center and brighter away from the center to achieve a uniform brightness across the projected image.

Figure 8:
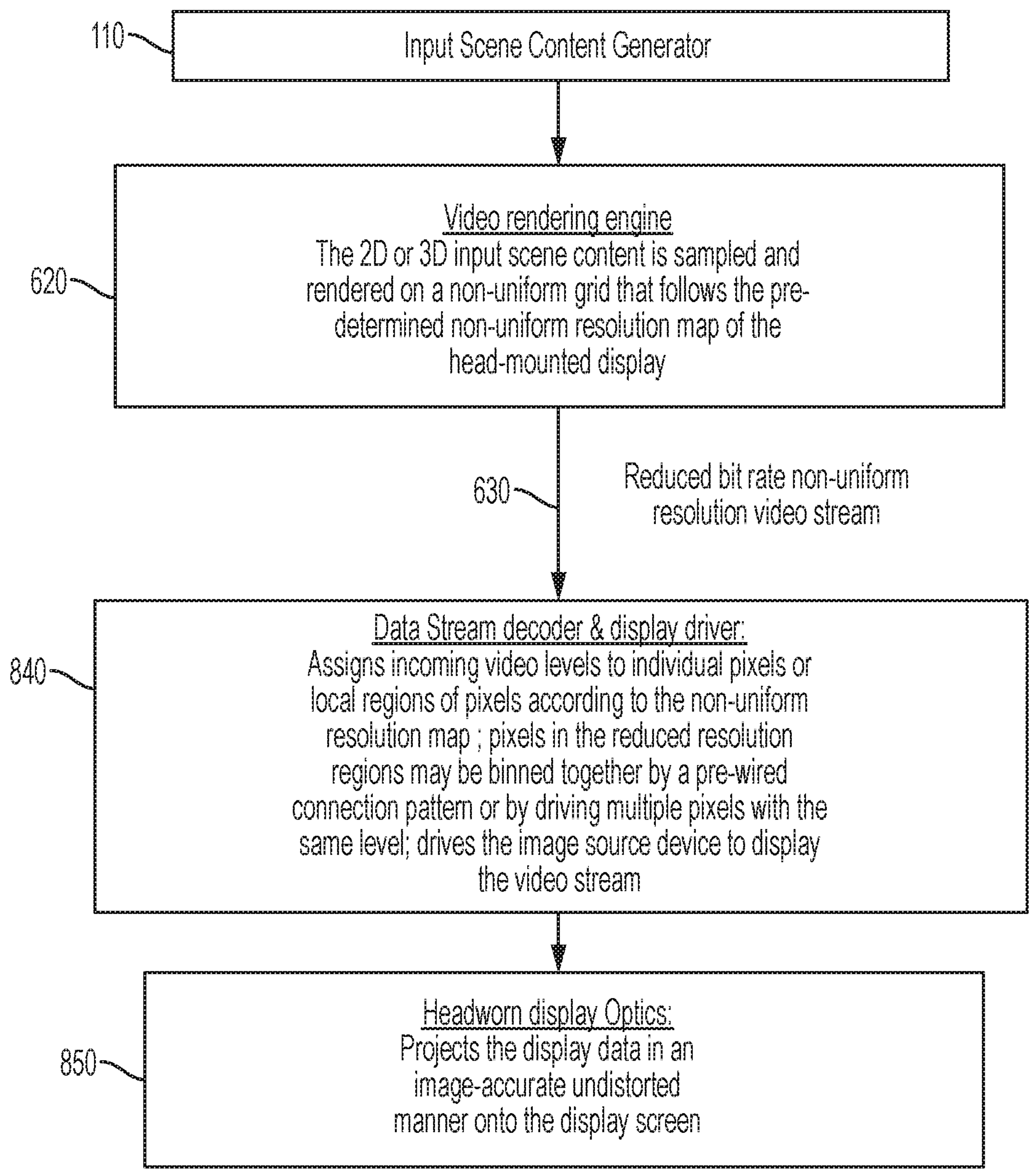
FIG. 8 Process Flow diagram for fixed-pattern non-uniform resolution headworn display Embodiment 2

FIG. 8 shows a process flow diagram for embodiment 2. Like embodiment 1, this embodiment uses a fixed non-uniform resolution distribution such as that shown in FIG. 5 or FIG. 2*a* or 2*b*, but unlike embodiment 1, the non-uniform pixel distribution is realized on the image source device itself. Since the non-uniform resolution distribution is mapped directly onto the image source device, the distribution will consist of regions or zones where the pixel size is an integer number of pixels combined to effectively create a single larger pixel. The headworn display optics 850 used to relay the video from the image source device to the eye relays an accurate image of the image source device to the user, whether the display optics is one of the types shown in FIG. 3 or FIG. 4 where a custom contact lens is employed, or one of the many types of relay optics that creates an eyebox or expanded exit pupil at the viewer's eyes. The first three elements in the process flow diagram for embodiment 2, namely the input scene content generator 110, the video rendering engine 620, and the reduced bit-rate non-uniform resolution data stream 630, are the same as were described for embodiment 1. The data stream decoder and display driver 840 receives the data stream 630 and uses the known non-uniform resolution distribution to drive the display. The decoder identifies which resolution zone each of the pixels in the data stream belongs to, i.e., to the central zone where the effective pixel size is equal to the image source device pixel size, or to some reduced resolution zone where the effective pixel size is equal to 2, 3, 4, or some other integer number of image source device pixels. Pixels in the reduced resolution zones may be binned together using a pre-wired connection pattern applied after or during the manufacture of the image source device. In other words, the image source device may be manufactured as a device with uniform pixel size but then through an added step during or after the device manufacture, an interconnection pattern is included to connect local groups of 2, 3, or more pixels into larger effective pixels. Alternatively, pixels in the reduced resolution zones may be binned together by the data stream decoder and display driver, by manner of identifying a given pixel to be a member of which reduced resolution zone, and driving a local region of 2, 3, or more pixels with the same drive level to effectively create bigger pixels.

Embodiment 2 shown in FIG. 8 has novel features 620, the video rendering engine that renders according to the non-uniform resolution distribution pattern (e.g., FIG. 5), and 840, the data stream decoder and display driver that determines to which resolution zone each pixel belongs and then drives the appropriate pixel (if the pixel binning has been hard-wired) or pixels (in the case where the display driver performs the pixel binning). The pixel binning on the image source device, which is novel to Embodiment 2 is shown in FIG. 2*a*.

In another version of embodiment 2, the image source device may have been manufactured with pixels of a range of sizes arranged according to a desired non-uniform resolution distribution as shown in FIG. 2*b*. In that case, no binning is required and data stream decoder and display driver, identifies the pixel location of each incoming pixel and drives the appropriate image source device pixel. An image source device manufactured with varying pixel sizes as shown in FIG. 2*b* represents another novel feature of embodiment 2.

Figure 9:
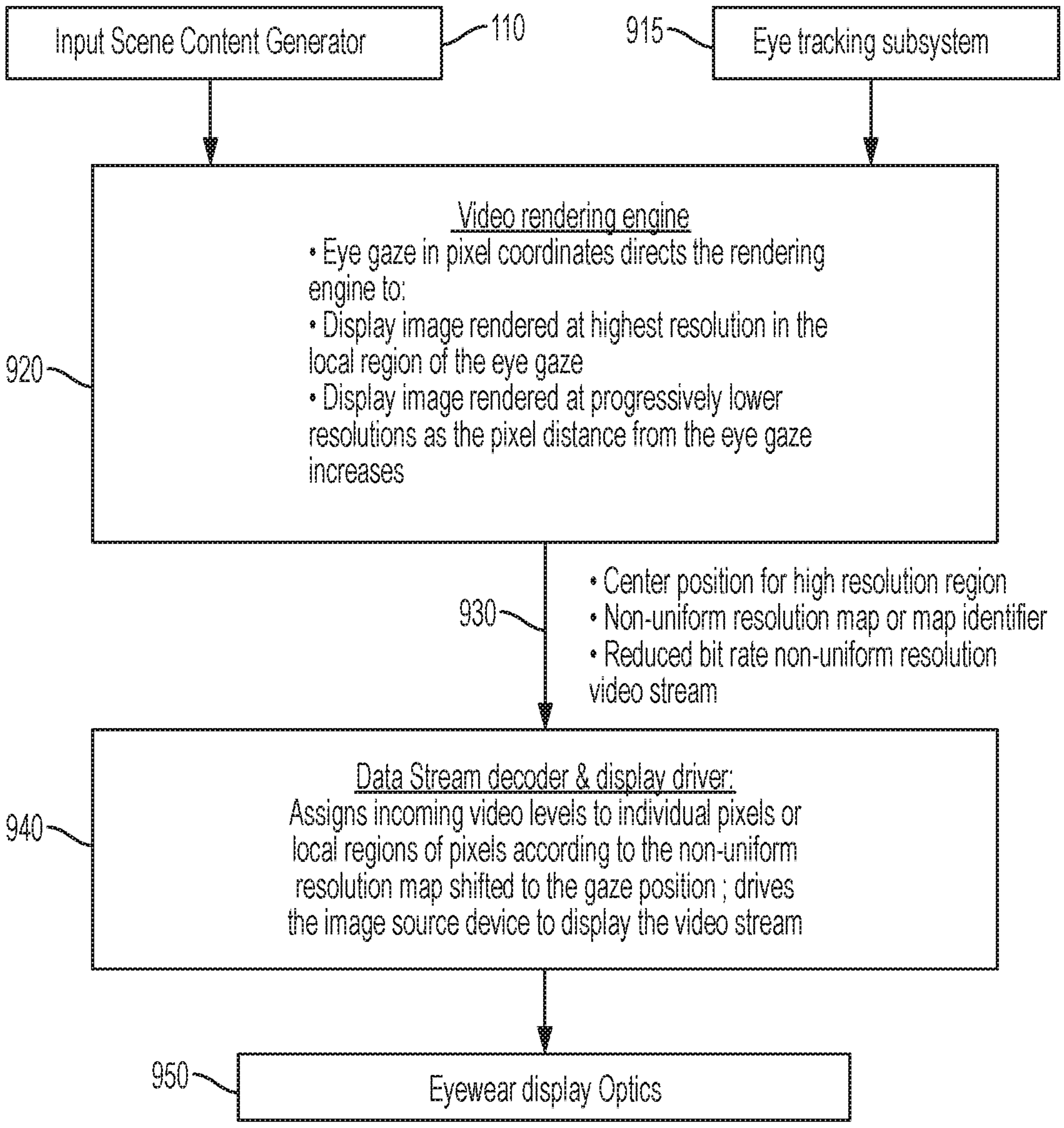
FIG. 9 Process Flow diagram for dynamic-pattern non-uniform resolution headworn display Embodiment 3.
Figure 10:
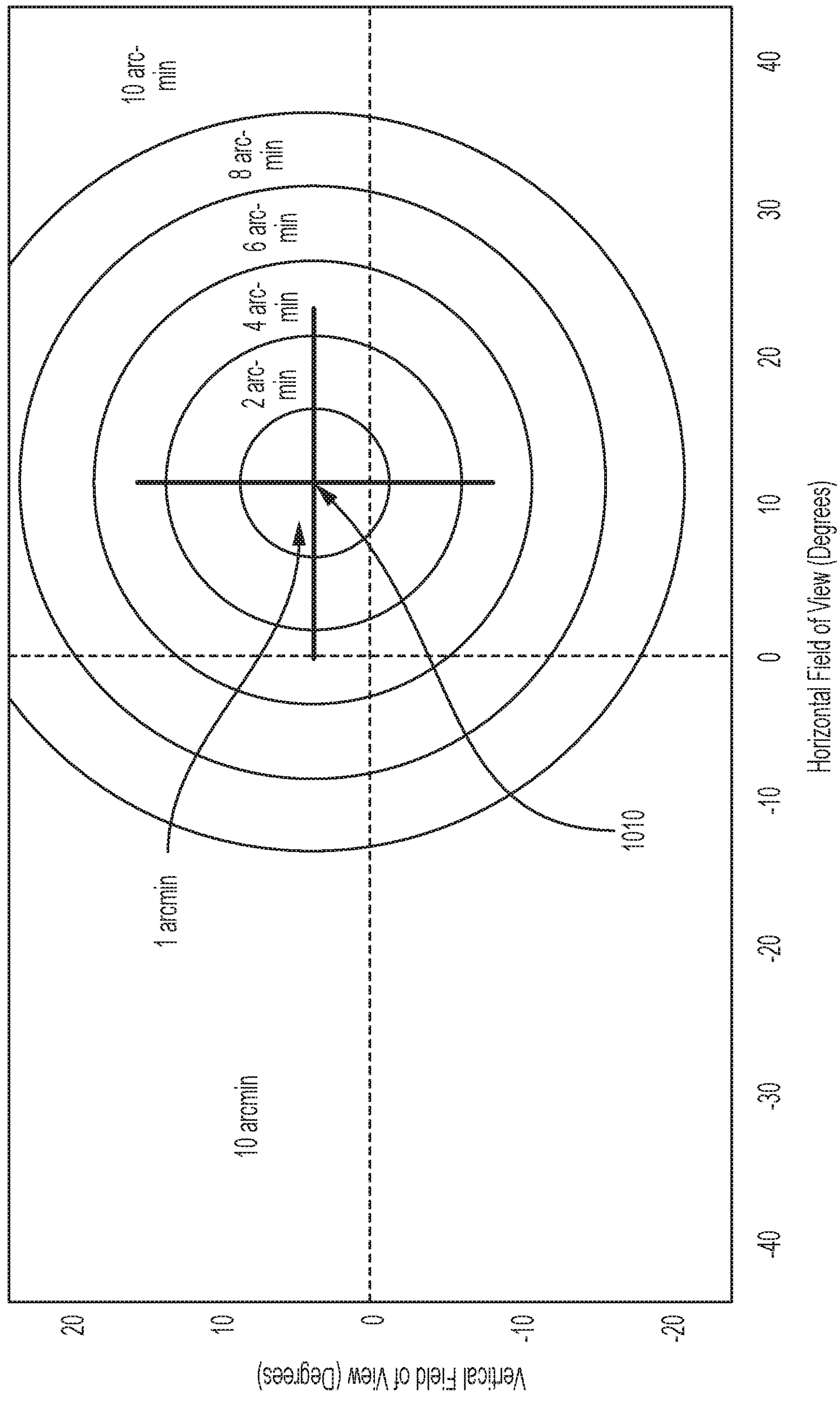
FIG. 10 Diagram showing a dynamic non-uniform resolution distribution pattern as a function of angle over the field of view.

FIG. 9 shows the process flow diagram for embodiment 3. This embodiment uses a dynamically shifting non-uniform resolution distribution. Rather than having a large central high resolution region to accommodate eye motion, the non-uniform resolution distribution moves around in the FOV along with the eye. An eye-tracking subsystem 915 is used to provide the position of the eye to the video rendering engine 920. A pre-determined non-uniform resolution distribution is used to display the pixels but the center of this distribution moves within the FOV so that it always occurs at the position where the eye is currently pointed. Since there is no need to accommodate eye motion within the central high resolution region in this embodiment, resolution can begin to roll-off at a FOV similar to the resolution roll-off of the human eye. For example, a suitable distribution in this embodiment, as shown in FIG. 10, may be 1 arcmin resolution in the central 5-degree radius relative to the eye's gaze position in the FOV, 2 arcmin in the annulus from 5- to 10-degree from the eye gaze center, 4 arcmin in the annulus from 10- to 15-degree from the eye gaze center, 6 arcmin in the annulus from 15- to 20-degrees, 8 arcmin in the annulus from 20- to 25-degrees, and 10 arcmin for anything greater than 25 degrees. The actual boundary radii and resolution values for the non-uniform resolution zones within the FOV will be determined using human factors testing and may vary from the values given. A strength of this dynamic non-uniform resolution embodiment is that the number of pixels needed to fill a given FOV is even further reduced compared to embodiments with a static non-uniform resolution distribution. For example, again consider a display with 100° diagonal FOV and 16:9 aspect ratio. If we use the zone boundaries and pixel sizes just stated, then the total number of pixels needed for this FOV is approximately 760,000 pixels. The viewer still perceives it as a 100° FOV with image sharpness corresponding to 20/20 vision (i.e., 1 arcmin resolution), while the number of pixels that need to be rendered and transmitted has dropped from 15.1 Million pixels (for uniform 1 arcmin pixels over 100° FOV) to only 760 Thousand pixels, a savings in computation (in the rendering engine 920), power, and bandwidth (in the data stream transmission 930), of roughly 95%.

In addition to the reduced bit-rate data stream 930, the rendering engine 920 must also transmit the center position (eye gaze position) and identify the non-uniform resolution distribution used to render the pixels. In many cases, the non-uniform resolution distribution will be pre-stored in the data stream decoder and display driver 940 so that it is only necessary to transmit the center position along with the reduced bit-rate pixel data. In this embodiment 3 with dynamic shifting of the non-uniform resolution distribution, the display driver 940 performs the dynamic pixel binning. This requires an image source device that has a uniform distribution of pixels of the size corresponding to the highest resolution in order that the high resolution center of the distribution can be positioned anywhere within the FOV. Using the known non-uniform distribution and the location of the center or eye gaze position, the display driver 940 drives single pixels in the highest resolution zone around the gaze center with the pixel levels for this zone. It drives local groups of 2, 3, 4, or more device pixels with the appropriate pixel drive level in lower resolution zones to create effectively larger pixels in these zones. Any type of display optics 950 that relays a clear image of the image source device to the eye can be used with embodiment 3.

Novel features of Embodiment 3 include the dynamic non-uniform resolution distribution pattern which moves within the field of view corresponding to the instantaneous eye gaze center 1010 as shown in FIG. 10. FIG. 9 shows additional novel features of embodiment 3 including 920, the video rendering engine which renders the pixels with non-uniform resolution following the pre-determined dynamic non-uniform resolution distribution pattern shifted to a position of the eye gaze center as determined by an eye tracking subsystem, and 940, the data stream decoder and display driver that drives the pixels in the image source device performing active pixel binning to realize the dynamic non-uniform resolution distribution shifted to the proper eye gaze position by driving pixel clusters of 2, 3, or more pixels in the lower resolution zones with the same drive level to effectively create larger (lower resolution) pixels.

Figure 11B:
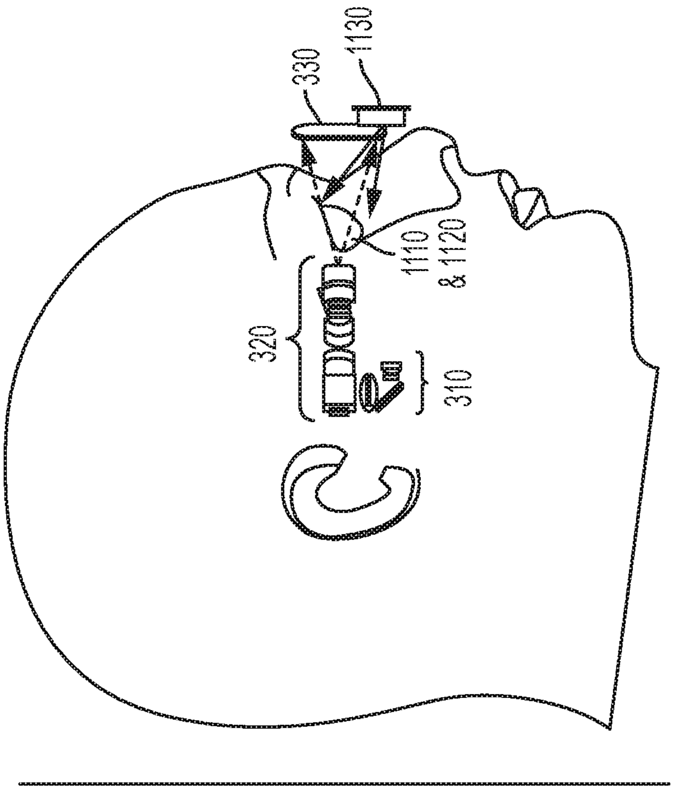
FIG. 11 Diagram showing an eye tracking system used in an embodiment of a dynamic non-uniform resolution display (a) eye tracking system with fiducial in contact lens and light source/photodetector module (b) eye tracking system incorporated into an embodiment of the non-uniform resolution headworn display FIG. 12 Static-pattern non-uniform resolution display engine with means to dynamically shift the display center in response to an eye-tracking signal FIG. 13 Process Flow diagram for peripheral non-uniform resolution headworn display Embodiment 4.
Figure 11A:
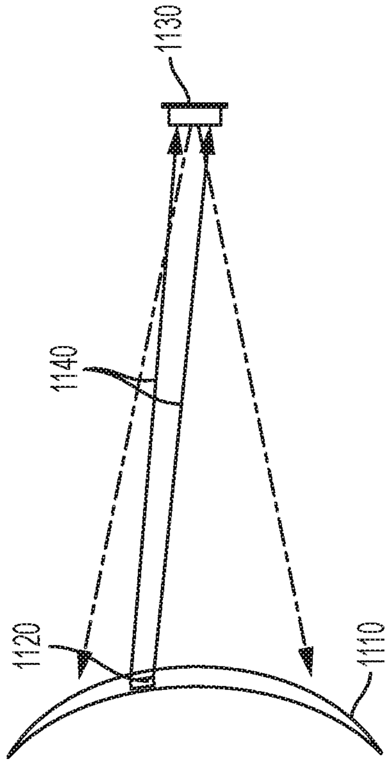

One realization of Embodiment 3 is shown in FIG. 11. A non-uniform resolution mapping that changes dynamically with eye motion requires input from an eye tracking subsystem. The eye tracking method shown in FIG. 11(*a*) includes detecting a light signal from a fiducial 1120 included in a contact lens 1110, and tracking the fiducial by analyzing the light signal. Since the contact lens with its fiducial moves together with the eye, the gaze direction of the eye is known by tracking the motion of the fiducial and adding the fixed offset from the position of the fiducial to the position of the eye pupil. A light beam 1140 travelling from the fiducial to the transceiver is detected by photodetector element(s) in the transceiver module. The transceiver 1130 may contain a light source which illuminates the eye and interacts with the fiducial creating light beam 1140 from the fiducial 1120 back to the transceiver 1130. The fiducial 1120 may be a retroreflector or a diffuse reflector. Alternatively, the fiducial may itself be a light emitter, either powered by some electronic means with components embedded into the contact lens 1110 (in which case there would be no light emitter in the transceiver 1120), or a photoluminescent element that generates light of some wavelength when illuminated by light of a different wavelength. The photodetector(s) and associated optics in the transceiver module receives the light 1140 from the fiducial and produces an output signal that indicates the instantaneous position of the fiducial.

FIG. 11(*b*) shows an embodiment of a dynamic non-uniform resolution headworn display using the eye tracking system of FIG. 11(*a*). The user is wearing a contact lens 1110 containing an eye tracking fiducial 1120. The transceiver module 1130 is mounted on the headworn eyewear. Novel features of this embodiment include the eye-borne optics (contact lens with eye tracking fiducial) that facilitate eye tracking, and the use of this to provide essential gaze direction information to the video rendering engine in order to properly register the non-uniform resolution mapping with the portion of the scene being viewed. Headworn display systems that already use a contact lens for some other function, such as those shown in FIGS. 3 and 4, can include the eye tracking fiducial in their contact lens to gain the advantages of a dynamically positioned non-uniform resolution mapping with very little added system complexity.

Figure 12:
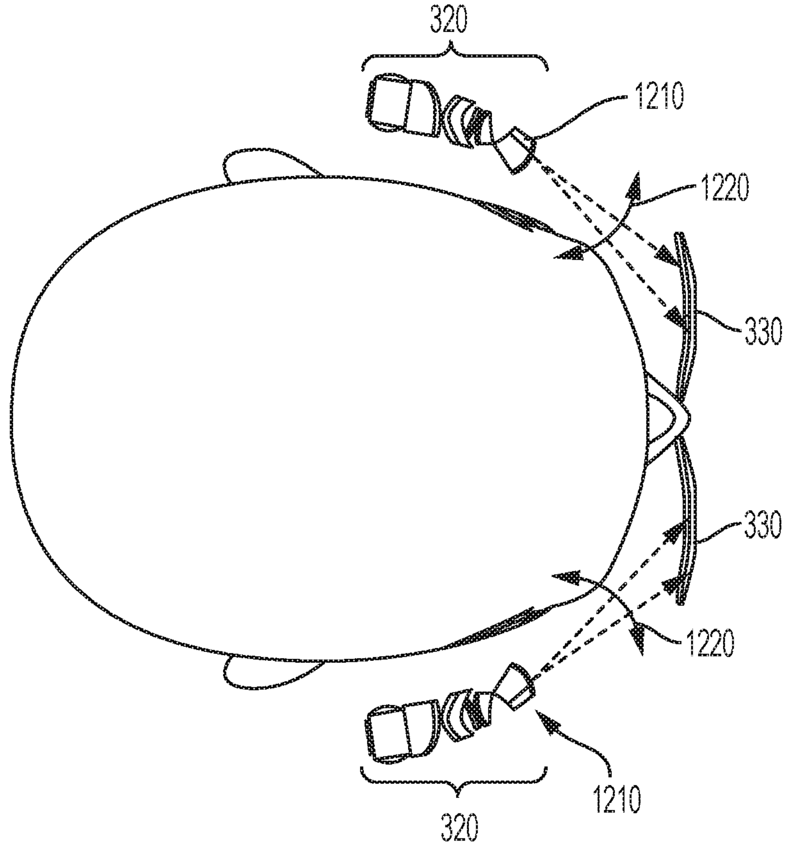

Another method for implementing a dynamic non-uniform headworn display is shown in FIG. 12. In this embodiment, a means to laterally (horizontally or vertically) shift the display beam of a system with a static non-uniform resolution mapping is added to the system. The position of the static non-uniform resolution mapping within the display FOV seen by the user is shifted in response to an eye tracking signal such that the high resolution portion of the mapping is always centered at the position corresponding to the instantaneous gaze direction of the user. The lateral shifting of the display beam position 1220 can be accomplished in a number of ways. These include an opto-electronic beamsteering element 1210 added to the static non-uniform resolution display projection system, or the electro-mechanical transverse shifting of an image source device that has a fixed non-uniform resolution pixel mapping (e.g. accomplished through hardwired pixel binning or a display panel with pixels of varying size as shown in FIG. 2). Novel features of this embodiment include that it enables the higher computational savings associated with dynamically changing the center position of the non-uniform resolution mapping (fewer total pixels due to the smaller size of the highest resolution central region since the region shifts with eye motion) while also reducing the number of pixels in the image source device since lower resolution, large pixels are permanently configured either in the image source device or the display projection optics.

Figure 13:
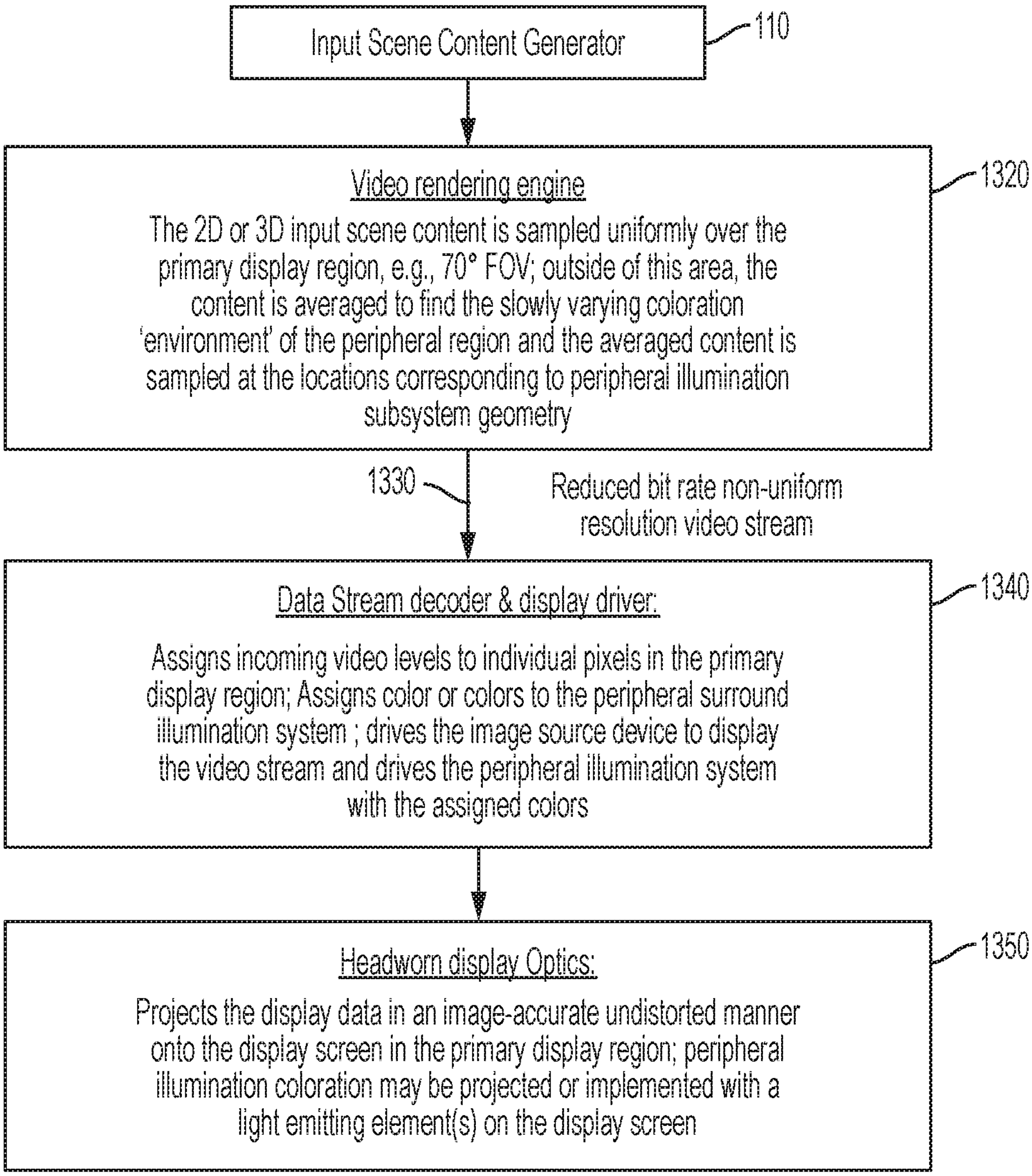
Figure 14A:
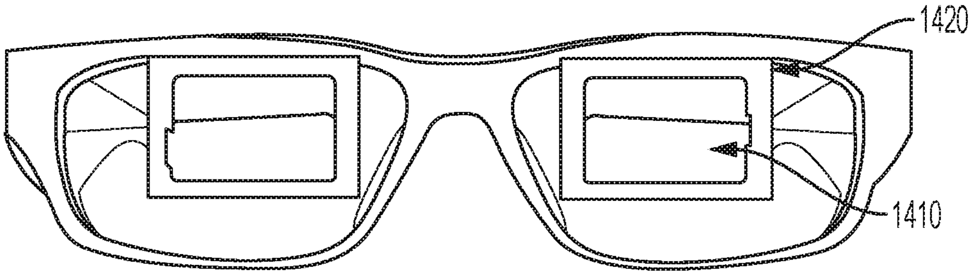
FIG. 14 Implementation diagram for peripheral non-uniform resolution headworn display Embodiment 4.
Figure 14B:
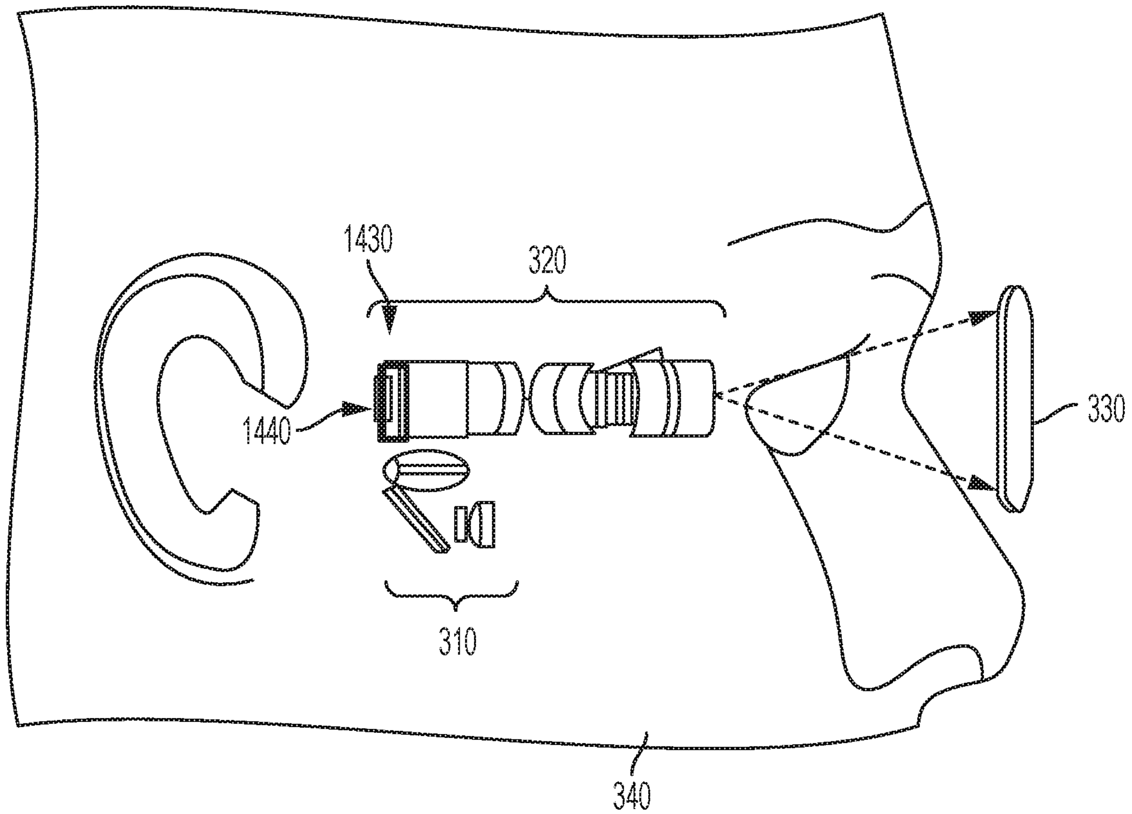

FIG. 13 shows the process flow diagram for embodiment 4. Embodiment 4 uses a non-uniform resolution distribution that consists of a central region also known as the primary display region and a peripheral surround region. The primary display region may consist of a reasonably large FOV such as 50°-75° diagonal FOV. The peripheral surround region is very low resolution information (in the range of 1 to 10's of degrees per pixel) that sets the background environment for the scene or information depicted in the primary display region. The input content generator 110 is the same as used in previously described embodiments. The video rendering engine 1320 renders the pixels in the primary display region based on the gaze direction of the user, getting this information from the built in head position and orientation sensor or from an optional eye-tracking subsystem. The pixels in the primary display region are rendered either with a uniform equal pixel size and spacing or with a dynamic gaze-following non-uniform resolution distribution as in embodiment 3. Outside of the primary display region, the content is averaged (low-pass filtered) over local regions consistent with the spacing of the peripheral illumination system pixels. The spacing of the peripheral illumination pixels varies depending on the implementation of the display optics 1350 for the peripheral region. For example, if the peripheral surround region is implemented using the remaining FOV outside of the primary display region of a projection system such as shown in FIG. 3, then the surround region pixels are generated by local regions of the image source device pixels driven with a common drive level for each local region of device pixels. In that case, the effective pixel spacing may be 10's of arcmin out to a few degrees. Alternatively, as shown in FIG. 14, the peripheral surround illumination is created using LEDs or other light emitting devices (OLED, light pipe fed by remote illumination, electroluminescent devices, to name a few examples) mounted around the edge of the image source device 1430, or around the edge of the transparent display screen 1420, the pixel spacing may range from a few degrees to a few tens of degrees. The purpose of this low-resolution surround illumination is to provide a feeling of extended FOV without containing any detailed scene information.

The data stream 1330 bit rate is dominated by the pixels in the primary display region. Even if the primary display region is made up of uniformly distributed pixels, the bit rate is reduced compared to a display with a fully immersive FOV and if it is made up of dynamically shifting binned pixels as in embodiment 3, then the pixel bit-rate is further reduced. The peripheral surround illumination pixels, by virtue of their large spacing represent a very small part of the data in the data stream.

The data stream decoder and display driver 1340 receives the data stream and determines which pixels are used to drive the image source device for the primary display and which are routed to the peripheral illumination system if different from the image source device. The display driver 1340 also provides the appropriate drive signals to the image source device and to the peripheral illumination system.

The headworn display optics 1350 for the primary display region can be of any type that relays a clear image of the image source device to the user's eye. In this embodiment, the headworn display optics 1350 also include a peripheral illumination system. This peripheral illumination may be implemented using remaining pixels at the peripheral FOV region of the image source device or, as shown in FIG. 14, may be realized using LEDs or some other light emitting devices around the periphery of the image source device or around the periphery of the primary display region on the transparent screen or other image surface available in the primary display optical system.

The peripheral surround illumination also has the capability of being selectively switched ON or OFF by the user. When ON, the peripheral surround illumination extends the effective field of view and provides a more immersive VR or AR experience. When OFF, the primary display area remains a large enough FOV to provide a rich VR or AR experience but now the user can see a view of the real world outside of the primary display area which may help to reduce the dizzying effect known as cyber sickness, experienced by some users of fully immersive VR displays.

Embodiment 4 as shown in FIG. 13 and FIG. 14 has novel features 1320, the video rendering engine which renders the primary display region using uniform resolution or dynamic non-uniform resolution and renders the surround illumination pixels by averaging the surrounding information and sampling corresponding to the spacing of the peripheral surround pixels, 1340 the display driver, which drives the pixels in the primary display region as well as driving the peripheral surround pixels, and 1420 or 1440, the peripheral surround pixel light emitters configured around the image source device or an image surface of the primary display region.

Figure 15:
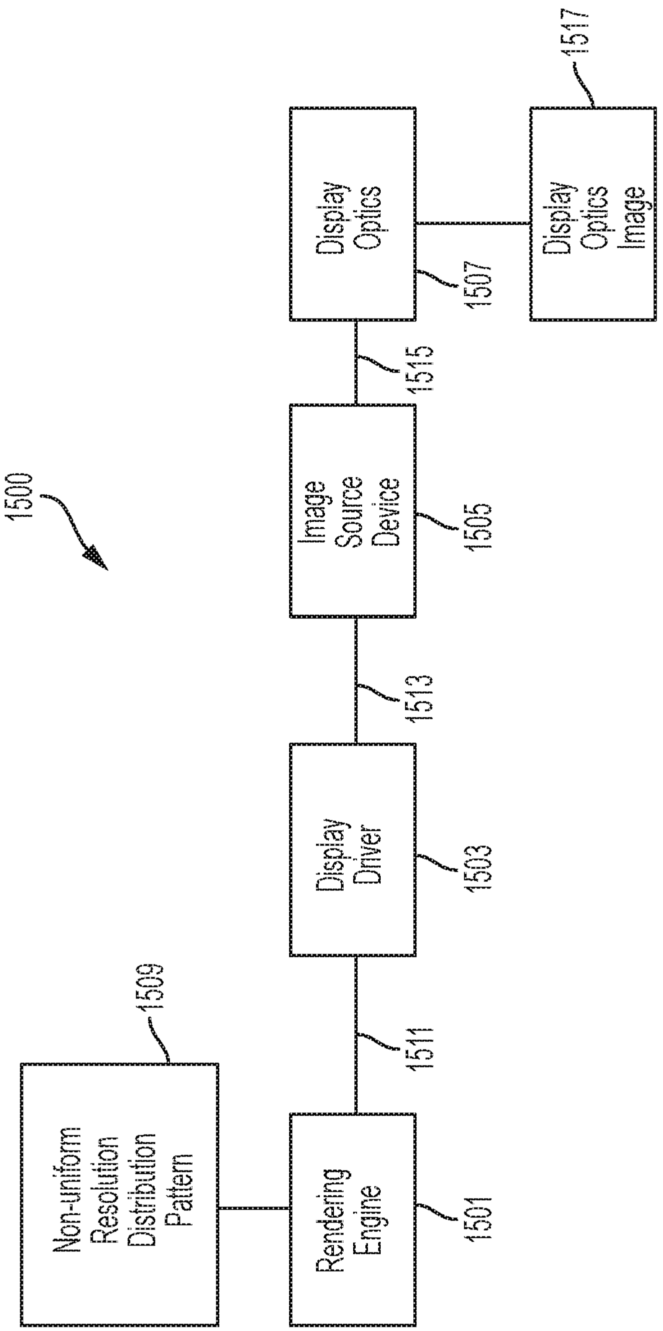
FIG. 15 shows a display system in accordance with some embodiments of the present disclosure.

FIG. 15 shows a display system 1500 in accordance with some embodiments of the present disclosure. The display system 1500 includes a rendering engine 1501, a display driver 1503, an image source device 1505, and display optics 1507. The rendering engine 1501 is coupled to the display driver 1503. The display driver 1503 is coupled to the image source device 1505. And the image source device 1505 is coupled to the display optics 1507.

The rendering engine 1501, in some embodiments, includes software and hardware that forms images for display. The display driver 1503 provides an interface between the rendering engine 1501 and the image source device 1505. In some embodiments, the display driver 1503 includes general purpose hardware and software. In some embodiments, the display driver 1503 includes an application specific circuit designed to interface to the image source device 1505. The image source device 1505, in some embodiments, includes one or more pixels for generating an image. Exemplary images generated by the image source device 1505 includes text, drawings, and photographs. The display optics 1507 includes one or more optical components, such as lenses, beam, splitters, and mirrors to produce an image suitable for viewing by a human observer.

In operation, the rendering engine 1501 receives a non-uniform resolution distribution pattern 1509 and generates one or more rendered pixels 1511. The display driver 1503 receives the one or more rendered pixels 1511 from the rendering engine 1501 and generates one or more display driver pixels 1513. The image source device 1505 receives the one or more display driver pixels 1513 from the display driver 1503 and generates an image 1515. And the display optics 1507 receives the image 1515 from the image source device 1505 and provides a display optics image 1517 having a space-variant resolution that follows the non-uniform resolution distribution pattern 1509.

Figure 16:
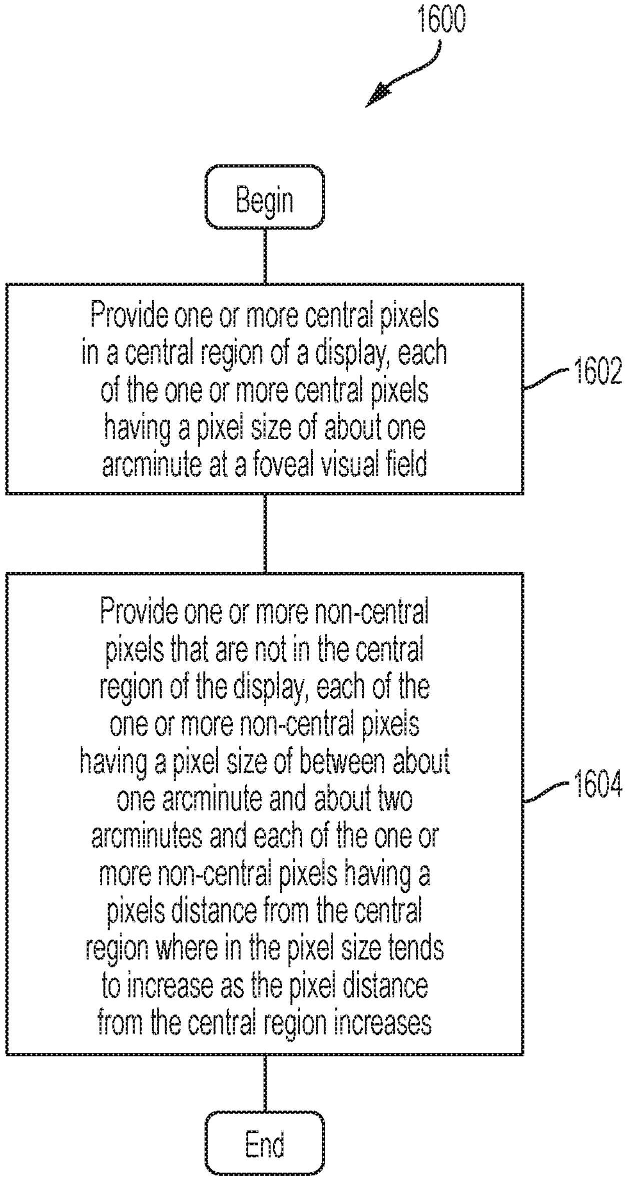
FIG. 16 shows a flow diagram for a method in accordance with some embodiments of the present disclosure.

FIG. 16 shows a flow diagram for a method 1600 in accordance with some embodiments of the present disclosure. The method 1600 includes providing one or more central pixels in a central region of a display, each of the one or more central pixels having a pixel size of about one arcminute at a foveal visual field (block 1602); and providing one or more non-central pixels that are not in the central region of the display, each of the one or more non-central pixels having a pixel size of between about one arcminute and about two arcminutes and each of the one or more non-central pixels having a pixel distance from the central region wherein the pixel size tends to increase as the pixel distance from the central region increases (block 1604).

This concludes the detailed description of the invention and its various embodiments. To summarize, we have described headworn display systems with large FOV (700 diagonal or larger) that display the information to the user with non-uniform resolution. Because the human eye itself has non-uniform acuity, the non-uniform resolution distribution presented by the display is designed to be consistent with the human visual system so that, even though the displayed information becomes less sharp as the angle away from the central viewing axis increases, the user will not perceive this decrease in image sharpness. But, from the system point of view, the number of pixels that must be rendered, transmitted, and displayed, decreases significantly compared to a system with uniform resolution for the same FOV, resulting in significant savings in power, bandwidth, and computational complexity.

Reference throughout this specification to "an embodiment," "some embodiments," or "one embodiment." means that a particular feature, structure, material, or characteristic described in connection with the embodiment is included in at least one embodiment of the present disclosure. Thus, the appearances of the phrases such as "in some embodiments," "in one embodiment," or "in an embodiment," in various places throughout this specification are not necessarily referring to the same embodiment of the present disclosure. Furthermore, the particular features, structures, materials, or characteristics may be combined in any suitable manner in one or more embodiments.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A display system comprising:

a rendering engine to receive a non-uniform resolution distribution pattern and to generate one or more rendered pixels for a virtual environment, each of the one or more rendered pixels calculated for a perspective view from a user's location in the virtual environment and applying one or more texture and lighting rules to the rendered pixels;

a display driver to receive the one or more rendered pixels and to generate one or more display driver pixels;

an image source device to receive the one or more display driver pixels and to generate an image; and display optics to receive the image and to provide a display optics image having a space-variant resolution that follows the non-uniform resolution distribution pattern.

2. The display system of claim 1, wherein the image source device includes an array of non-uniformly distributed pixels having a resolution substantially consistent with the non-uniform resolution distribution pattern such that the display driver drives each pixel with a single pixel's data from the display driver pixels.

3. The display system of claim 2, further comprising an opto-electronic beamsteering system to laterally shift the display output to provide dynamic motion of the non-uniform resolution distribution pattern within the field of view.

4. The display system of claim 1, wherein the display optics includes intentional distortion to provide the display optics image with a space-variant resolution that follows the non-uniform resolution distribution pattern.

5. The display system of claim 1, wherein the non-uniform resolution distribution pattern includes a high resolution area of a sire sufficient enough to accommodate movement of a user's eye such that a non-uniform resolution mapping is fixed and unchanging relative to a field of view.

6. A display system comprising:

a rendering engine to receive a non-uniform resolution distribution pattern and to generate one or more rendered pixels for a virtual environment, each of the one or more rendered pixels calculated for a perspective view from a user's location in the virtual environment and applying one or more texture and lighting rules to the rendered pixels;

a display driver to receive the one or more rendered pixels and to generate one or more display driver pixels;

an image source device to receive the one or more display driver pixels and to generate an image, the image source device includes an array of substantially uniformly sized pixels, the display driver to drive a plurality of the array of substantially uniformly sized pixels to create one or more effectively larger pixels according to the non-uniform resolution distribution pattern; and display optics to receive the image and to provide a display optics image having a space-variant resolution that follows the non-uniform resolution distribution pattern.

7. The display system of claim 6, further comprising an eye-tracking system, wherein the display optics includes a field of view and the non-uniform-resolution distribution pattern includes a center that moves dynamically within the field of view in response to a user's eye motion signal provided to the rendering engine by the eye-tracking system.

8. The display system of claim 7, wherein the non-uniform resolution distribution pattern includes an area of lower resolution and the display driver actively drives a plurality of pixels with the same information in the area of lower resolution to provide dynamic motion of the non-uniform resolution distribution pattern within the field of view.

9. A display system comprising:

a rendering engine to receive a non-uniform resolution distribution pattern and to generate one or more rendered pixels for a virtual environment, each of the one or more rendered pixels calculated for a perspective view from a user's location in the virtual environment and applying one or more texture and lighting rules to the rendered pixels;

a display driver to receive the one or more rendered pixels and to generate one or more display driver pixels;

an image source device to receive the one or more display driver pixels and to generate an image;

display optics to receive the image and to provide a display optics image having a space-variant resolution that follows the non-uniform resolution distribution pattern, the display optics includes intentional distortion to provide the display optics image with a space-variant resolution that follows the non-uniform resolution distribution pattern; and an illumination device to provide an illumination beam including a center and an edge, the illumination beam having a greater brightness near the edge than at the center, and the image source device to receive the illumination beam.

10. A display system comprising:

a rendering engine to receive a non-uniform resolution distribution pattern and to generate one or more rendered pixels for a virtual environment, each of the one or more rendered pixels calculated for a perspective view from a user's location in the virtual environment and applying one or more texture and lighting rules to the rendered pixels;

a display driver to receive the one or more rendered pixels and to generate one or more display driver pixels;

an image source device to receive the one or more display driver pixels and to generate an image, the image source device includes an array of substantially uniformly sized pixels, the display driver to drive a plurality of the array of substantially uniformly sized pixels to create one or more effectively larger pixels according to the non-uniform resolution distribution pattern;

display optics to receive the image and to provide a display optics image having a space-variant resolution that follows the non-uniform resolution distribution pattern; and an eye-tracking system, wherein the display optics includes a field of view and the non-uniform-resolution distribution pattern includes a center that moves dynamically within the field of view in response to a user's eye motion signal provided to the rendering engine by the eye-tracking system, the eye tracking system including a transceiver system and a contact lens including a fiducial having an instantaneous position, the transceiver system to detect light from the fiducial and to provide a signal including the instantaneous position.

11. A display system comprising:

a rendering engine to receive a non-uniform resolution distribution pattern and to generate one or more rendered pixels for a virtual environment, each of the one or more rendered pixels calculated for a perspective view from a user's location in the virtual environment and applying one or more texture and lighting rules to the rendered pixels;

a display driver to receive the one or more rendered pixels and to generate one or more display driver pixels;

an image source device to receive the one or more display driver pixels and to generate an image, the image source device includes an array of non-uniformly distributed pixels having a resolution substantially consistent with the non-uniform resolution distribution pattern such that the display driver drives each pixel with a single pixel's data from the display driver pixels;

display optics to receive the image and to provide a display optics image having a space-variant resolution that follows the non-uniform resolution distribution pattern; and an electro-mechanical lateral translation system to provide lateral translation of the fixed non-uniform resolution image source device to provide dynamic motion of the non-uniform resolution distribution pattern within the field of view.

12. A display system comprising:

a rendering engine to receive a non-uniform resolution distribution pattern and to generate one or more rendered pixels for a virtual environment, each of the one or more rendered pixels calculated for a perspective view from a user's location in the virtual environment and applying one or more texture and lighting rules to the rendered pixels;

a display driver to receive the one or more rendered pixels and to generate one or more display driver pixels;

an image source device to receive the one or more display driver pixels and to generate an image;

display optics to receive the image and to provide a display optics image having a space-variant resolution that follows the non-uniform resolution distribution pattern; and a peripheral illumination system to provide peripheral illumination, wherein the distribution pattern and the display optics include a central primary display region and a peripheral region surrounding the central region, the peripheral region illuminated by the peripheral illumination system and wherein the distribution pattern and the display optics include a central primary display region and a surrounding region including peripheral illumination.

13. The display system of claim 12, wherein the primary display region includes substantially uniform resolution.

14. The display system of claim 12, wherein the primary display region includes substantially non-uniform resolution.

15. The display system of claim 14, wherein substantially non-uniform resolution includes a high resolution center and progressively lower resolution as a distance from the high resolution center increases.

16. The display system of claim 12, wherein the peripheral illumination system includes one or more light emitters arranged around the image source device.

17. The display system of claim 12, wherein the primary display includes a field of view area and the peripheral illumination system includes one or more light emitters arranged around the field of view area.

18. The display system of claim 12, further comprising an interface to provide control to the peripheral illumination.

19. A display system comprising:

a rendering engine to receive a non-uniform resolution distribution pattern and to generate one or more rendered pixels;

a display driver to receive the one or more rendered pixels and to generate one or more display driver pixels;

an image source device to receive the one or more display driver pixels and to generate an image, the image source device includes an array of substantially uniformly sized pixels, the display driver to drive a plurality of the array of substantially uniformly sized pixels to create one or more effectively larger pixels according to the nonuniform resolution distribution pattern;

display optics to receive the image and to provide a display optics image having a space-variant resolution that follows the nonuniform resolution distribution pattern; and an eye-tracking system, wherein the display optics includes a field of view and the non-uniform-resolution distribution pattern includes a center that moves dynamically within the field of view in response to a user's eye motion signal provided to the rendering engine by the eye-tracking system, the eye tracking system including a transceiver system and a contact lens including a fiducial having an instantaneous position, the transceiver system to detect light from the fiducial and to provide a signal including the instantaneous position, wherein the fiducial includes a diffuse reflector.

* * * * *